United States Patent
Sube et al.

(10) Patent No.: US 6,735,839 B2
(45) Date of Patent: May 18, 2004

(54) METHOD OF MANUFACTURING A MULTILAYER PIEZOELECTRIC COMPONENT

(75) Inventors: Mitsuru Sube, Yokaichi (JP); Yoshiaki Kohno, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/125,641

(22) Filed: Apr. 19, 2002

(65) Prior Publication Data

US 2002/0135277 A1 Sep. 26, 2002

Related U.S. Application Data

(62) Division of application No. 09/451,907, filed on Dec. 1, 1999, now Pat. No. 6,437,488.

(30) Foreign Application Priority Data

Dec. 1, 1998 (JP) .......................................... 10-342003
Dec. 1, 1998 (JP) .......................................... 10-342004
Dec. 1, 1998 (JP) .......................................... 10-342005

(51) Int. Cl.[7] ............................................ H04R 17/00
(52) U.S. Cl. .......................... 29/25.35; 29/830; 29/831; 29/832; 29/846; 29/854
(58) Field of Search ................................. 310/328, 366, 310/320, 358, 359; 338/21, 273, 274, 332; 29/25.35, 830, 831, 832, 854, 846

(56) References Cited

U.S. PATENT DOCUMENTS

| | | | | |
|---|---|---|---|---|
| 4,649,313 A | * | 3/1987 | Ogawa et al. | 310/358 |
| 5,028,831 A | | 7/1991 | Malocha et al. | |
| 5,075,665 A | * | 12/1991 | Taira et al. | 338/21 |
| 5,237,239 A | * | 8/1993 | Inoue et al. | 310/328 |
| 5,245,734 A | * | 9/1993 | Issartel | 29/25.35 |
| 5,294,859 A | | 3/1994 | Yamanouchi et al. | |
| 5,610,565 A | * | 3/1997 | Maeda et al. | 333/185 |

FOREIGN PATENT DOCUMENTS

| | | |
|---|---|---|
| JP | 2-267977 | 11/1990 |
| JP | 8-306984 | 11/1996 |
| JP | 9-275325 | 10/1997 |
| JP | 10-4330 | 1/1998 |
| JP | 10-84244 | 3/1998 |
| JP | 10-125968 | 5/1998 |
| JP | 10-126203 | 5/1998 |
| JP | 10-241993 | 9/1998 |

* cited by examiner

Primary Examiner—Carl J. Arbes
Assistant Examiner—Tai V Nguyen
(74) Attorney, Agent, or Firm—Keating & Bennett, LLP

(57) ABSTRACT

A method of manufacturing a multilayer piezoelectric component includes the step of providing a compact and sintered ceramic body including a piezoelectric ceramic material and having opposite first and second sides. First and second external electrodes are respectively provided on the first and second sides of the compact ceramic sintered body. A plurality of internal electrodes are stacked in the ceramic sintered body so as to overlap each other with ceramic layers disposed therebetween in the thickness direction. The internal electrodes are arranged to be electrically connected to the first or second external electrode. A dummy electrode is provided between an end of at least one of the internal electrodes opposite to the end connected to one of the external electrodes, and the other external electrode not connected to the at least one internal electrode at the height where the at least one internal electrode is located. The dummy electrode suppresses diffusion of an internal electrode constituent metal from the internal electrodes to the dummy electrode side.

1 Claim, 31 Drawing Sheets

METHOD OF MANUFACTURING A MULTILAYER PIEZOELECTRIC COMPONENT

This application is a Divisional of U.S. patent application Ser. No. 09/451,907 filed Dec. 1, 1999, now U.S. Pat. No. 6,437,488.

BACKGROUND OF THE INVENTION

1. Field of the Invention

The present invention relates to multilayer piezoelectric components each including a plurality of internal electrodes stacked between ceramic layers. Particularly, the present invention relates to a multilayer piezoelectric actuator and a method of manufacturing the same, an ink jet head using the piezoelectric actuator, a multilayer piezoelectric resonator used as a resonator, a band pass filter, or other electronic component, and a method of manufacturing the same, a piezoelectric transformer and a method of manufacturing the same.

The present invention also relates to a piezoelectric actuator having an electrode structure which is improved so as to significantly decrease variations in displacement and a manufacturing method therefor, an ink jet head, a multilayer piezoelectric resonator including a sintered compact body having an electrode structure which is improved to significantly widen a difference ΔF between the resonance frequency and antiresonance frequency, and to significantly decrease variations in resonance characteristics, and a manufacturing method therefor, a piezoelectric transformer having an electrode structure improved to significantly increase maximum efficiency and decrease variations in the maximum efficiency, and a manufacturing method therefor.

2. Description of the Related Art

An ink jet head of an ink jet printer uses a piezoelectric actuator for discharging a predetermined amount of ink. An example of conventional piezoelectric actuators will be described below with reference to FIG. 33.

A piezoelectric actuator 71 includes a sintered ceramic compact body 72. The sintered ceramic compact body 72 includes piezoelectric ceramic material such as lead titanate zirconate ceramic or the like.

In the sintered ceramic compact body 72, a plurality of internal electrodes 73a to 73l are arranged to overlap each other in the thickness direction. The internal electrodes 73a, 73c, 73e, 73g, 73i, and 73k are extended to the first side 72a of the sintered ceramic compact body 72. The other internal electrodes 73b, 73d, 73f, 73h, 73j, and 73l are extended to the second side 72b opposite to the first side 72a.

First and second external electrodes 74 and 75 are disposed on the first side 72a and the second side 72b, respectively.

The ceramic layers disposed between the internal electrodes 73a to 73l are polarized in the thickness direction, as shown by arrows in FIG. 33. Namely, the ceramic layers on both sides of each of the internal electrodes are polarized in opposite directions of the thickness direction.

Therefore, application of a voltage between the external electrodes 74 and 75 causes displacement in a polarized portion of the piezoelectric actuator 71 due to a piezoelectric effect.

In an ink jet head of a conventional ink jet printer, displacement is caused in the piezoelectric actuator 71 to press an ink chamber so that a predetermined amount of ink is discharged from the ink chamber. Therefore, in order to discharge ink with high precision, it is required to decrease variations in displacement of the piezoelectric actuator 71.

However, the manufacture of many piezoelectric actuators 71 causes relatively large variations in displacement characteristics in the piezoelectric actuators. There is also the problem of causing variations in displacement in displacement portions when a plurality of notches are formed in the displacement portions of the piezoelectric actuator 71 in order to form a plurality of displacement portions.

Therefore, for example, an ink jet head of an ink jet printer including the above-described piezoelectric actuator is difficult to discharge a predetermined amount of ink with high precision.

FIG. 34 is a sectional view showing a conventional multilayer piezoelectric resonator.

A multilayer piezoelectric resonator 171 includes a sintered ceramic compact body 172 made of piezoelectric ceramic.

In the sintered ceramic compact body 172, a plurality of internal electrodes 173a to 173l are provided. The stacking direction of the internal electrodes 173a to 173l is located in the thickness direction. The sintered ceramic compact body 172 includes ceramic layers which are held between the internal electrodes in the thickness direction, and polarized as shown by arrows in FIG. 34. Namely, the adjacent ceramic layers are polarized in opposite directions in the thickness direction. The internal electrodes 173a to 173l are extended up to the opposite sides 712a and 172b of the sintered ceramic compact body 172.

Insulating films 174a to 174f and insulating films 175a to 175f are disposed on the sides 192a and 172b, respectively, of the sintered ceramic compact body 172. Each of the insulating films 174a to 174f and 175a to 175f is arranged to cover an exposed end of any one of the internal electrodes 173a to 173l on either of both sides 172a and 172b of the sintered ceramic compact body 172. Therefore, an end of each of the internal electrodes 173a to 173l is coated with any one of the insulating films 174a to 175f, the other end being exposed from the side 172a or 172b.

External electrodes 176 and 177 are arranged to cover both sides 172a and 172b, respectively.

In the multilayer piezoelectric resonator 171, an alternating current electric field is applied between the external electrodes 176 and 177 to expand and contract the piezoelectric ceramic layers held between the respective internal electrodes 173a to 173l due to the piezoelectric effect, thereby obtaining resonance characteristics based on thickness longitudinal vibration.

However, in the piezoelectric resonator 171, resonance characteristics cannot be necessarily obtained according to design values, and a difference ΔF between the resonance frequency and antiresonance frequency tends to be lower than the desired value. A decrease in the frequency difference ΔF narrows the pass band of the filter.

Furthermore, the manufacture of many multilayer piezoelectric resonators 171 produces the problem of relatively large variations in resonance characteristics.

Also a Rosen-type piezoelectric transformer using a rectangular plate-shaped piezoelectric ceramic layer is conventionally known.

An example of conventional Rosen-type piezoelectric transformers will be described below with reference to FIGS. 35 and 36. A piezoelectric transformer 251 includes a rectangular plate-shaped sintered ceramic compact body 252 made of piezoelectric ceramic. The sintered ceramic compact body 252 is obtained by stacking green sheets with internal electrodes disposed therebetween, and then firing the resultant layered product, as shown in FIG. 36.

As shown in FIG. 36, green sheets 253 to 266 mainly composed of a piezoelectric ceramic powder are stacked in the direction shown in the drawing. First internal electrodes 267 are respectively disposed on the green sheets 253, 259, and 263 by screen printing conductive paste. Similarly, second internal electrodes 268 are respectively disposed on the green sheets 256, 262, and 266 by screen printing conductive paste.

Each of the first and second internal electrodes 267 and 268 contacts one end of a green sheet in the length direction. The first and second internal electrodes 267 and 268 are also arranged to overlap each other with ceramic layers held therebetween in the thickness direction. In the sintered ceramic compact body 252 (FIG. 35) as a final product, the internal electrodes 267 are exposed from the first side 252a along the longer side, and the second internal electrodes 268 are exposed from the second side 252b opposite to the first dies 252a.

A first external electrode 269 is located in a portion of the first side 252a of the sintered ceramic compact body 252 in which the first internal electrodes 267 are exposed. Although not shown in the drawings, a second external electrode is also disposed on the second side 252b to be electrically connected to the second internal electrodes 268.

A direct-current voltage is applied between the first and second external electrodes to polarize the ceramic layers held between the respective first and second internal electrodes 267 and 268 in the thickness direction. In addition, a third external electrode 270 is disposed on a third side 252c along the short side of the sintered ceramic compact body 252.

Furthermore, a direct-current voltage is applied between the first external electrodes 269, the second external electrode and the third external electrode 270 to polarize the right-hand portion of the sintered ceramic compact body 252, where the internal electrodes 267 and 268 are not stacked, in the length direction of the sintered ceramic compact body, as shown by arrow P.

In the piezoelectric transformer 251, for example, the first external electrode 269 and the second external electrode function as input-side electrodes so that an input voltage is applied between the first and second external electrodes to excite the sintered ceramic compact body 252 in a length direction vibration mode, obtaining a stepped-up output voltage from the third external electrode 270 as an output electrode.

However, the piezoelectric transformer 251 cannot obtain maximum efficiency according to a desired value, and thus has a problem in that the maximum efficiency tends to be lower than the desired value. In addition, when the sintered ceramic compact body 252 is obtained by preparing a mother layered product for improving productivity, cutting the mother layered product into units of piezoelectric transformers 251 to obtain layered product chips, and then firing the layered product chips, or when the sintered ceramic compact body 252 is obtained by obtaining a mother sintered product, and then cutting the mother sintered product into sintered ceramic compact body 252 of piezoelectric transformer units, there is the problem of relatively large variations in maximum efficiency of the piezoelectric transformers 251 as final products.

SUMMARY OF THE INVENTION

In order to solve the above problems, preferred embodiments of the present invention provide multilayer piezoelectric components which minimize variations in component characteristics.

Preferred embodiments of the present invention provide a piezoelectric actuator causing less variation in displacement and a manufacturing method therefor, and an ink jet head capable of discharging a predetermined ink with high precision by using the actuator.

Preferred embodiments of the present invention also provide a multilayer piezoelectric resonator exhibiting a large difference $\Delta F$ between the resonance frequency and antiresonance frequency, and excellent resonance characteristics and minimizing variation in resonance characteristics, and a manufacturing method therefor.

Preferred embodiments of the present invention further provide a piezoelectric transformer which achieves an increase in maximum efficiency, and an effective decrease in variations in maximum efficiency.

As a result of study of the reason why large variations in displacement are caused in the piezoelectric actuator 71, it was confirmed that a constituent metal of the internal electrodes 73a to 73l in the sintered ceramic compact body 72 diffuses during firing to produce dimensions which deviate from design values, thereby causing variations in displacement. Therefore, it was discovered that a piezoelectric actuator causing significantly less variation in displacement can be obtained by suppressing diffusion of a constituent metal of the internal electrodes during firing. This led to the achievement of preferred embodiments of the present invention.

In other words, a piezoelectric actuator according to preferred embodiments of the present invention has a structure in which diffusion of a constituent metal of internal electrodes is suppressed during firing, thereby decreasing variations in displacement.

As a result of study of the reason why a conventional multilayer piezoelectric resonator causes a small frequency difference $\Delta F$ and variations in resonance characteristics, the inventors also discovered that a metal used in internal electrodes, for example, silver, diffuses into ceramic during firing which causes the internal electrodes to be different from to design values. Therefore, the inventors considered that by suppressing the diffusion of the internal electrode constituent metal into ceramic, the frequency difference $\Delta F$ can be greatly increased, and variations in resonance characteristics can be minimized. This led to the achievement of preferred embodiments of the present invention.

Furthermore, as a result of various studies in consideration of the phenomenon that a maximum efficiency according to design values cannot be obtained in the conventional piezoelectric transformer 251, the inventors discovered that in the sintered ceramic compact body 252 as a final product, the internal electrodes 267 and 268 having dimensions according to design values cannot be obtained, and electrodes are partially broken. A constituent metal of the internal electrodes, such as silver, which constitutes the internal electrodes, diffuses to the ceramic side during firing to prevent formation of the internal electrodes according to design values, thereby decreasing the maximum efficiency and causing variations in the maximum efficiency.

In other words, on the basis of the above-mentioned findings and discoveries, the inventors determined that by suppressing diffusion of a constituent metal of the internal electrodes during ceramic firing, the maximum efficiency can be greatly improved, and variations in the maximum efficiency can be minimized. This led to the achievement of preferred embodiments of the present invention.

Preferred embodiments of the present invention further provide a multilayer piezoelectric component including a sintered ceramic compact body made of piezoelectric ceramic and having opposite first and second sides, first and second external electrodes respectively disposed on the first and second sides of the sintered ceramic compact body, a plurality of internal electrodes stacked in the sintered ceramic compact body to overlap each other with ceramic layers held therebetween in the thickness direction, the internal electrodes being arranged to be electrically connected to the first or second external electrode; and a dummy electrode located at a height where at least one of the internal electrodes is provided, between an end of the at least one internal electrode opposite to the end connected to one of the external electrodes, and the other external electrode to which the at least one internal electrode is not connected.

The unique arrangement of the dummy electrode suppresses diffusion of the constituent metal of the internal electrodes toward the dummy electrode from the internal electrodes.

Preferred embodiments of the present invention further provides a piezoelectric actuator having the above-described construction.

In the piezoelectric actuator, in addition to the dummy electrode, a floating electrode may be provided to suppress the diffusion of the constituent metal of the internal electrodes in the thickness direction. In this case, as the floating electrode, at least one layer is preferably disposed in at least one of the ceramic layers between the adjacent internal electrodes in the stacking direction and/or the ceramic layers outside the outermost internal electrodes in the stacking direction.

In the piezoelectric actuator, the distance between the dummy electrode-side end of one of the internal electrodes and the dummy electrode is preferably about 100 $\mu$m or less, thereby effectively suppressing the diffusion of the internal electrode constituent metal to the dummy electrode side. With this distance over 100 $\mu$m, there is the small effect of suppressing the diffusion of the internal electrode constituent metal by providing the dummy electrode.

Preferred embodiments of the present invention further provide a multilayer piezoelectric resonator having the above construction.

A preferred embodiment of the present invention provides a multilayer piezoelectric component, which constitutes a piezoelectric transformer including the sintered ceramic compact body made of piezoelectric ceramic and having a substantially rectangular plate shape having the opposite first and second sides located on the longer side thereof, and opposite third and fourth sides located on the shorter side, the first and second external electrodes respectively located on portions of the first and second sides of the sintered ceramic compact body, which are close to the fourth side thereof, a third external electrode provided on the third side of the sintered ceramic compact body; the plurality of internal electrodes stacked in the sintered ceramic compact body to overlap each other with ceramic layers held therebetween in the thickness direction, and to be electrically connected to the first or second external electrode and the dummy electrode provided at the height where at least one of the internal electrodes is located, between the end of the at least one internal electrode opposite to the end connected to one of the external electrodes, and the other external electrode to which the at least one internal electrode is not connected.

The multilayer piezoelectric component may further include at least one floating electrode layer disposed in at least one of the ceramic layers between the adjacent internal electrodes in the stacking direction of the internal electrodes and/or the ceramic layers outside the outermost internal electrodes in the stacking direction, and arranged so as not to be electrically connected to the first and second external electrodes.

In the multilayer piezoelectric component, the distance between the dummy electrode-side end of one of the internal electrodes and the dummy electrode is preferably in the range from the thickness of each of the ceramic layers between the internal electrodes to about 300 $\mu$m.

Preferred embodiments of the present invention further provide a multilayer piezoelectric component including a sintered ceramic compact body made of piezoelectric ceramic and having opposite first and second sides, first and second external electrodes respectively disposed on the first and second sides of the sintered ceramic compact body, a plurality of internal electrodes stacked in the sintered ceramic compact body to overlap each other with ceramic layers held therebetween in the thickness direction, and to be electrically connected to the first or second external electrode, and at least one floating electrode layer disposed in at least one of the ceramic layers between the adjacent internal electrodes in the stacking direction of the internal electrodes and/or the ceramic layers outside the outermost internal electrodes in the stacking direction, and arranged so as not to be electrically connected to the first and second external electrodes.

The multilayer piezoelectric component may constitute a piezoelectric actuator or a multilayer piezoelectric resonator.

When the multilayer piezoelectric component constitutes a multilayer piezoelectric resonator, the internal electrodes and the floating electrode are arranged to extend up to the first and second sides of the sintered ceramic compact body, and insulating films may be further provided to cover exposed portions of the internal electrodes and/or the floating electrode on the first and second sides of the sintered ceramic compact body so that the internal electrodes are electrically connected to the first or second external electrode but not electrically connected to the other external electrode, and the floating electrode is not electrically connected to the external electrodes.

When the multilayer piezoelectric component constitutes a multilayer piezoelectric resonator, at least one dummy electrode may be provided between the end of at least one of the internal electrodes opposite to the end electrically connected to one of the external electrodes, and the other external electrode to which the internal electrode is not connected, in a plane where the at least one internal electrode is provided.

When the multilayer piezoelectric component constitutes a multilayer piezoelectric resonator, a plurality of floating electrode layers may be arranged in at least one of the ceramic layers between the adjacent internal electrodes in the stacking direction of the internal electrodes and/or the ceramic layers outside the outermost internal electrodes in the stacking direction.

Preferred embodiments of the present invention further provide the multilayer piezoelectric component which constitutes a piezoelectric transformer including the sintered ceramic compact body made of piezoelectric ceramic and having a substantially rectangular plate shape having the opposite first and second sides located on the longer side thereof, and opposite third and fourth sides located on the shorter side thereof, the first and second external electrodes respectively disposed on portions of the first and second sides of the sintered ceramic compact body, which are close to the fourth side thereof, the plurality of internal electrodes stacked in the sintered ceramic compact body to overlap each other with ceramic layers disposed therebetween in the thickness direction, and to be electrically connected to the first or second external electrode, and the at least one floating electrode layer disposed in at least one of the ceramic layers between the adjacent internal electrodes in the stacking direction of the internal electrodes and/or the ceramic layers outside the outermost internal electrodes in the stacking direction, and arranged so as not to be electrically connected to the first and second external electrodes.

Preferred embodiments of the present invention further provide a method of manufacturing a piezoelectric actuator including the steps of printing an internal electrode and dummy electrode on a green sheet including piezoelectric ceramic material, stacking a plurality of the green sheets, each having the internal electrode and the dummy electrode printed thereon, to obtain a layered product in which the plurality of internal electrodes extend to first and second sides alternately in the stacking direction, and the dummy electrodes are respectively arranged between the ends of the internal electrodes opposite to the ends extended to the first or second side, and the side to which the internal electrodes are not extended, firing the layered product to obtain a sintered ceramic compact body, respectively forming first and second external electrodes on the first and second sides of the sintered ceramic compact body, and applying a DC electric field between the first and second external electrodes to polarize the sintered ceramic compact body.

Preferred embodiments of the present invention further provide a method of manufacturing a piezoelectric actuator including the steps of printing an internal electrode and dummy electrode on a green sheet including piezoelectric ceramic material, printing a floating electrode on a green sheet, stacking a plurality of green sheets, each having an internal electrode and a dummy electrode printed thereon, and the green sheet on which the floating electrode is printed, to obtain a layered product in which at least one floating electrode is arranged in at least one of the ceramic layers between the adjacent internal electrodes in the stacking direction and/or the ceramic layers outside the outermost internal electrodes in the stacking direction, the plurality of internal electrodes being extended to first and second sides alternately in the stacking direction, and the dummy electrodes are respectively arranged between the ends of the internal electrodes opposite to the ends led to the first or second side, and the side to which the internal electrodes are not extended, firing the layered product to obtain a sintered ceramic compact body, respectively forming first and second external electrodes on the first and second sides of the sintered ceramic compact body, and applying a DC electric field between the first and second external electrodes to polarize the sintered ceramic compact body.

Preferred embodiments of the present invention further provide a method of manufacturing a multilayer piezoelectric resonator including the steps of printing an internal electrode pattern on a green sheet to obtain a first green sheet, printing a floating electrode pattern on a green sheet to obtain a second green sheet, stacking the first and second green sheets so that the floating electrode pattern is arranged on at least one of the green sheets between the adjacent internal electrode patterns in the stacking direction and/or the green sheets outside the outermost internal electrode patterns in the stacking direction to obtain a layered product, firing the layered product to obtain a mother sintered ceramic compact body, polarizing the mother sintered ceramic compact body by using the internal electrode patterns of the mother sintered ceramic compact body, cutting the mother sintered ceramic compact body to obtain a sintered ceramic compact body of a piezoelectric resonator unit, and respectively forming first and second external electrodes on opposite first and second sides of the sintered ceramic compact body so that the internal electrodes are electrically connected to only one of the external electrodes, and the floating electrode is not electrically connected to the external electrodes.

Preferred embodiments of the present invention provide a method of manufacturing a multilayer piezoelectric resonator wherein internal electrodes and a floating electrode are formed to extend up to first and second sides of the sintered ceramic compact body of each multilayer piezoelectric resonator unit, and the step of forming external electrodes on the first and second sides of the sintered ceramic compact body includes the steps of forming insulating films on the first and second sides of the sintered ceramic compact body to cover exposed portions of the internal electrodes and/or the floating electrode so that the internal electrodes are electrically connected to only one of first and second external electrodes but not electrically connected to the other external electrode, and the floating electrode is not electrically connected to the external electrodes, and forming the first and second external electrodes on the first and second sides of the sintered ceramic compact body after forming the insulating films.

In the method of manufacturing a multilayer piezoelectric resonator according to this preferred embodiment, in the step of obtaining the first green sheet, the internal electrode pattern and dummy electrode pattern may be printed on the green sheet.

In the method of manufacturing a multilayer piezoelectric resonator according to another preferred embodiment, in the step of obtaining the second green sheet, the floating electrode pattern and dummy electrode pattern may be printed on the green sheet.

Preferred embodiments of the present invention further provide a method of manufacturing a multilayer piezoelectric resonator including the steps of printing an internal electrode pattern and dummy electrode pattern on a green sheet to obtain a first green sheet, stacking at least a plurality of the first green sheets to obtain a mother layered product, firing the mother layered product to obtain a mother sintered ceramic compact body, polarizing the mother sintered ceramic compact body by using the internal electrode patterns, cutting the mother sintered ceramic compact body to obtain a sintered ceramic compact body of each piezoelectric resonator unit and respectively forming first and second external electrodes on opposite first and second sides of the sintered ceramic compact body so that the internal electrodes are electrically connected to at least one of the external electrodes.

Preferred embodiments of the present invention further provide a method of manufacturing a piezoelectric transformer including the steps of printing an internal electrode and dummy electrode on a green sheet, stacking a plurality of the green sheets each having the internal electrode and the dummy electrode printed thereon, to obtain a layered product having opposite third and fourth sides, in which the plurality of internal electrodes are extended to the opposite first and second sides alternately in the thickness direction, and the dummy electrodes are respectively arranged between the ends of the internal electrodes opposite to the ends extended to one of the external sides, and the other side to which the internal electrodes are not extended, firing the layered product to obtain a sintered ceramic compact body, respectively forming first and second external electrodes on portions of the first and second sides of the sintered ceramic compact body, to which the internal electrodes are extended, so that the external electrodes close to the fourth side, forming a third external electrode on the third side of the sintered ceramic compact body, and applying a DC electric field between the first and second external electrodes and the third external electrode to polarize the sintered ceramic compact body.

Preferred embodiments of the present invention further provide a method of manufacturing a piezoelectric transformer including the steps of printing an internal electrode and dummy electrode on a green sheet, printing a floating electrode on a green sheet, stacking a plurality of the green sheets each having the internal electrode and the dummy electrode printed thereon, and the green sheet on which the floating electrode is printed, to obtain a layered product having opposite third and fourth sides, in which at least one floating electrode layer is arranged in at least one of the ceramic layers between the adjacent internal electrodes in the stacking direction and/or the ceramic layers outside the outermost internal electrodes in the stacking direction, the plurality of internal electrodes are extended to the opposite first and second sides alternately in the thickness direction, and the dummy electrodes are respectively arranged between the ends of the internal electrodes opposite to the ends extended to one of the first and second sides, and the other side to which the internal electrodes are not extended, firing the layered product to obtain a sintered ceramic compact body, respectively forming first and second external electrodes on portions of the first and second sides of the sintered ceramic compact body, to which the internal electrodes are extended, so that the external electrodes are close to the fourth side, forming a third external electrode on the third side of the sintered ceramic compact body, and applying a DC electric field between the first and second external electrodes to polarize the sintered ceramic compact body, and applying a DC electric field between the first and second external electrodes and the third external electrode to polarize the sintered ceramic compact body.

Preferred embodiments of the present invention further provide an ink jet head including a nozzle for discharging ink, an ink chamber communicated with the nozzle and including at least one flexible wall, and any one of the above-described piezoelectric actuators arranged near the ink chamber, for pressing the ink chamber.

Other features, elements, applications, uses and advantages of the present invention will become apparent from the detailed description of preferred embodiments of the present invention below with reference to the attached drawings.

DETAILED DESCRIPTION OF PREFERRED EMBODIMENTS

The present invention will be described in detail below by describing preferred embodiments of the present invention with reference to the drawings.

A method of manufacturing a piezoelectric actuator in accordance with a first preferred embodiment of the present invention, and the structure of the piezoelectric actuator are described with reference to FIGS. 1A to 6.

First, a sheet is formed by a doctor blade method using slurry including a lead titanate zirconate piezoelectric ceramic power as a main component to obtain a green sheet having a thickness of about 20 $\mu$m to about 100 $\mu$m. The thus-formed green sheet is cut to have a substantially rectangular shape.

An internal electrode and a dummy electrode are then printed on the upper side of the green sheet. The printing is carried out by screen printing Ag—Pd paste to a thickness of about several $\mu$m, followed by drying. A plurality of the green sheets obtained as described above are stacked to obtain a layered product. The stacking method is described below with reference to FIG. 2.

Figure 2:
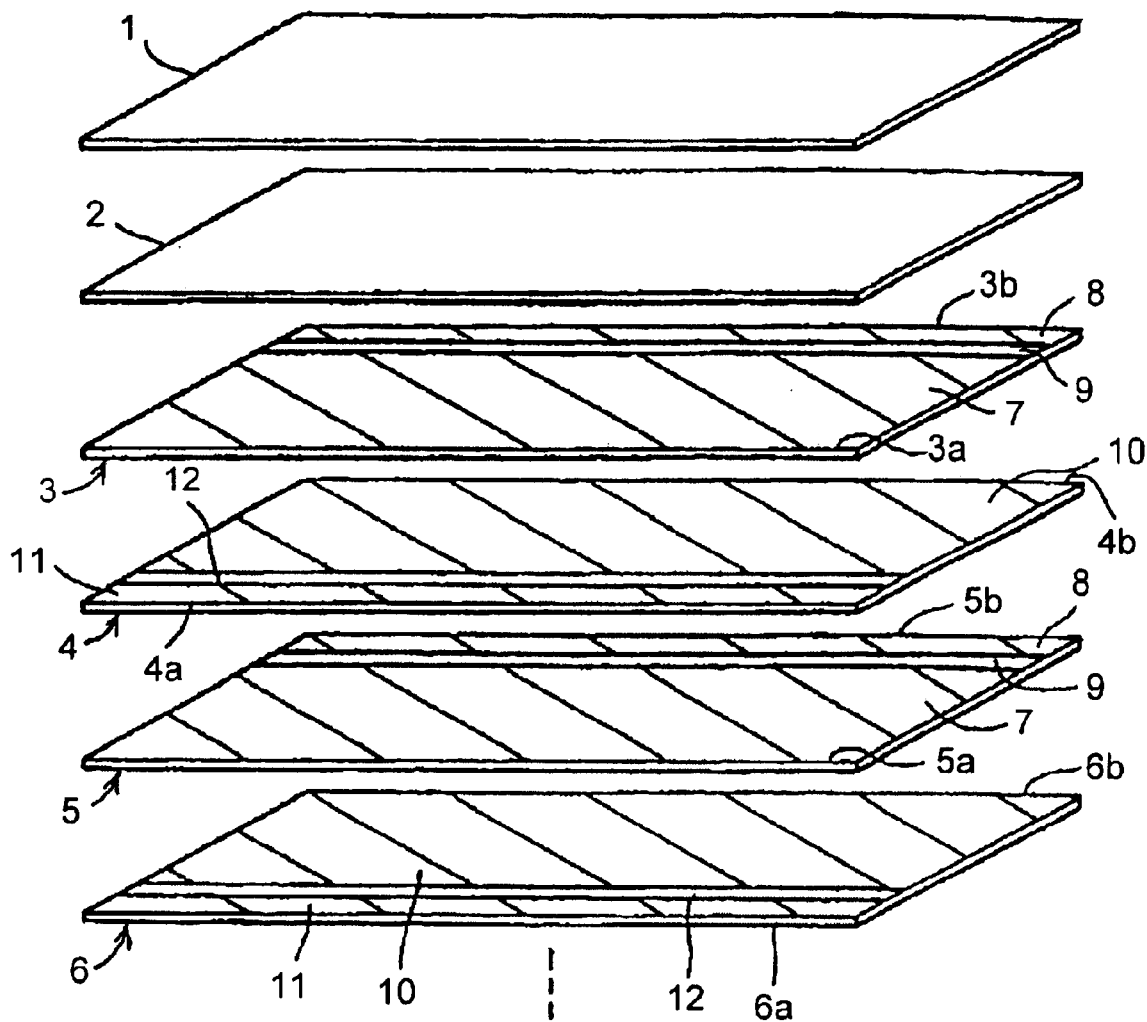
FIG. 2 is an exploded perspective view illustrating green sheets and electrode disposed thereon which are used for obtaining the piezoelectric actuator of the first preferred embodiment.

FIG. 2 shows green sheets 1 to 6 which constitute an upper portion of the layered product. The green sheets 1 and 2 are unpatterned green sheets on which the internal electrode and dummy electrode are not printed, and constitute the uppermost layer of the sheet layered product.

A first internal electrode 7 and first dummy electrode 8 are printed on each of the green sheets 3 and 5. The first internal electrode 7 is formed along the long-side edge 3a or 5a of the green sheet 3 or 5. The first dummy electrode 8 is formed along the other long-side edge 3b or 5b of the green sheet 3 or 5. The internal electrode 7 and the dummy electrode 8 are opposed with a gap 9 therebetween.

A second internal electrode 10 and first dummy electrode 11 are printed on each of the green sheets 4 and 6. The second internal electrode 10 and the second dummy electrode 11 are formed opposite to the first internal electrode 7 and the first dummy electrode 8, respectively, formed on each of the green sheets 3 and 5. Namely, the second dummy electrode 11 is formed along the edge 4a of the green sheet 4 overlapped with the edges 3a and 5a of the green sheets 3 and 5 in the layered product; the second internal electrode 10 is formed along the other edges 4b or 6b.

The second internal electrode 10 and the second dummy electrode 11 are opposed with a gap 12 therebetween.

The green sheets 3 and 5, and the green sheets 4 and 6 are alternately stacked in a plurality of layers, and the unpatterned green sheets 1 and 2 are stacked in the uppermost portion, with the same unpatterned green sheets (not shown) stacked in the lowermost layer, followed by compression in the thickness direction to obtain the layered product.

Figure 3A:
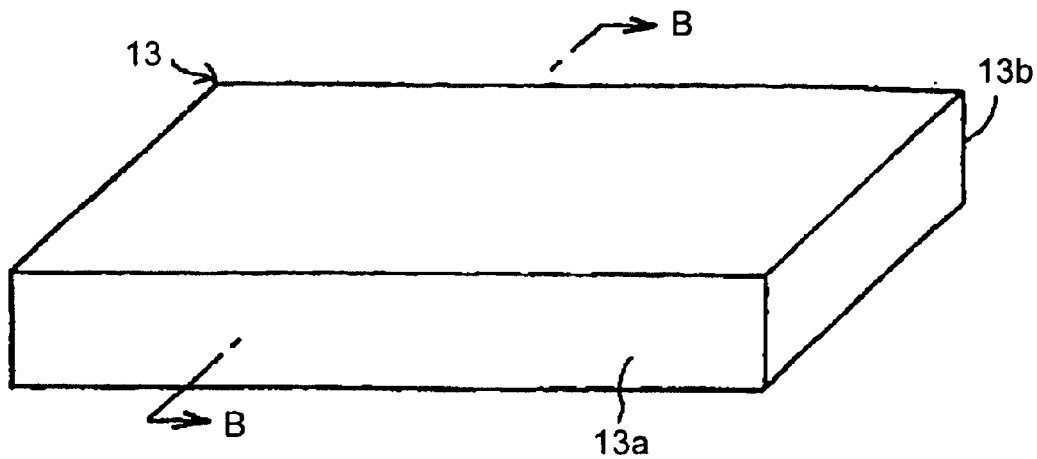
FIG. 3A is a perspective view showing a layered product prepared for obtaining the first preferred embodiment.
Figure 3B:
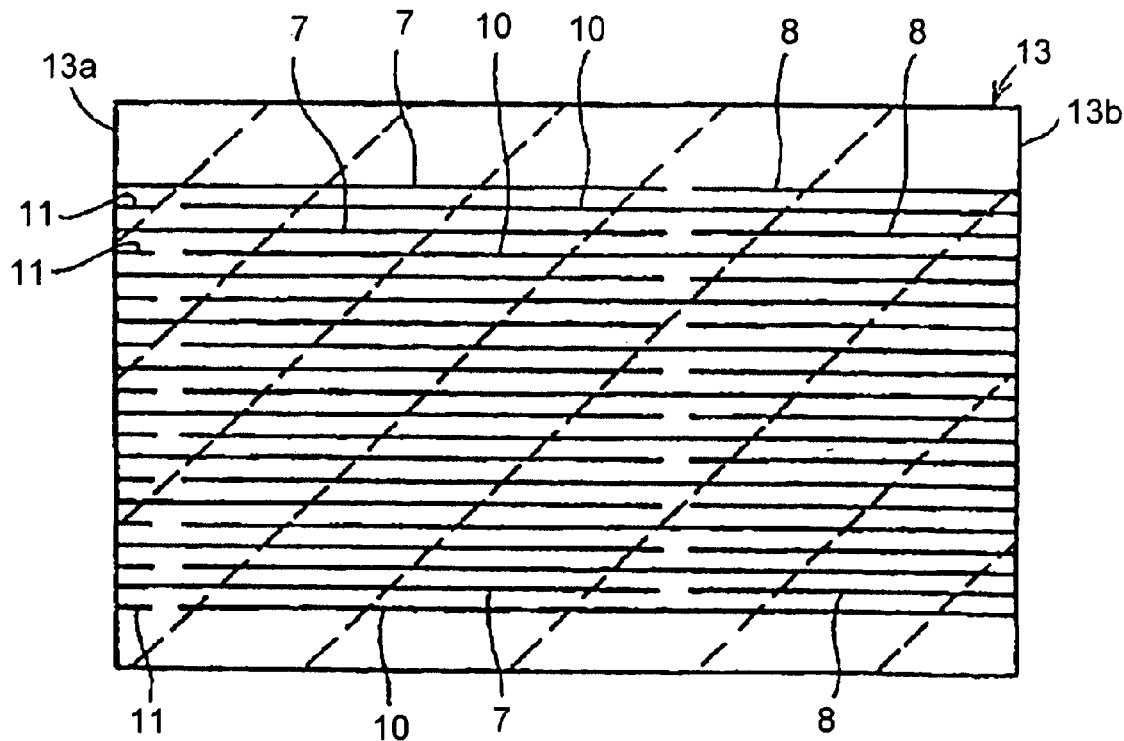
FIG. 3B is a sectional view taken along line B—B in FIG. 3A.

The thus-obtained layered product is shown in FIGS. 3A and 3B.

As be seen from FIG. 3B, a plurality of first internal electrodes 7 are extended to the first side 13a of a layered product 13; the second internal electrodes 10 are extended to the second side 13b.

The first dummy electrode 8 is disposed at the height where each of the first internal electrodes 7 is located, and extended to the second side 13b. Similarly, the second dummy electrode 11 is extended to the first side 13a at the height where each of the second internal electrodes 10 is located.

Next, the layered product 13 is fired at a temperature of about 1000° C. to about 1200° C. for several hours to obtain a sintered ceramic compact body.

Figure 4A:
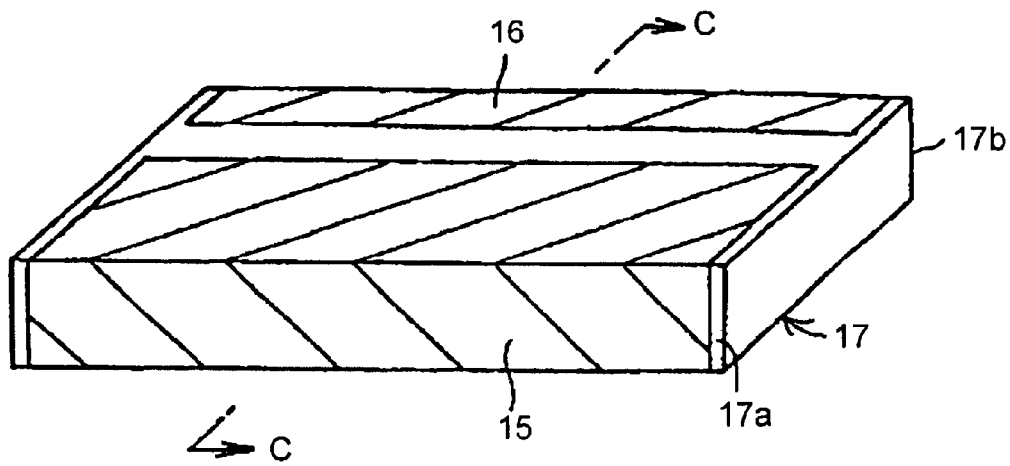
FIG. 4A is a perspective view illustrating a sintered ceramic compact body and external electrodes prepared in the first preferred embodiment.
Figure 4B:
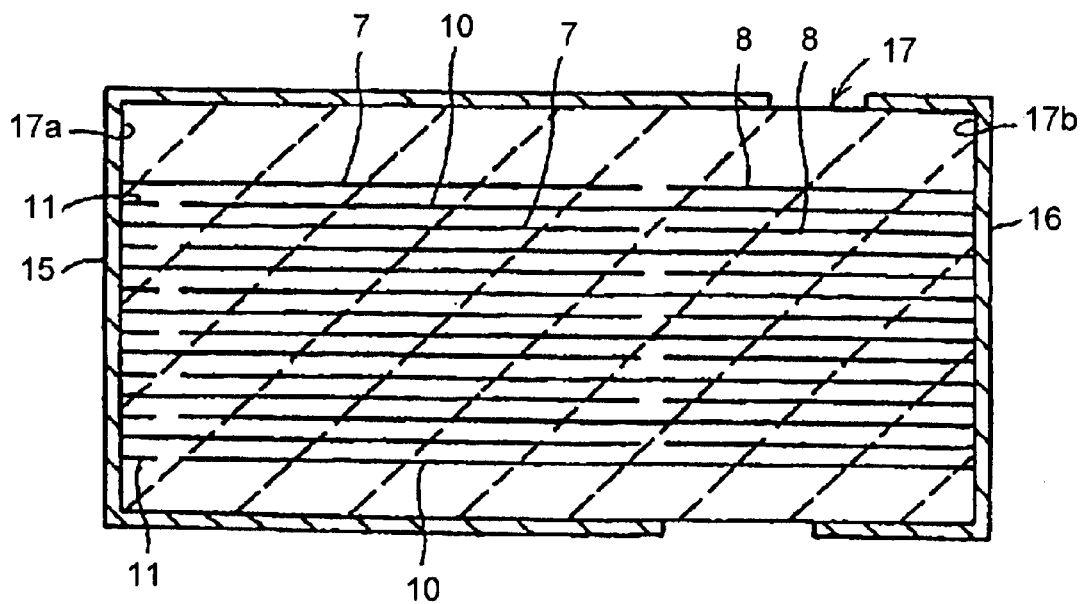
FIG. 4B is a sectional view taken along line C—C in FIG. 4A.

Then, first and second external electrodes are respectively arranged to cover the first and second sides of the sintered ceramic compact body obtained as described above. FIGS. 4A and 4B show a sintered ceramic compact body 17 on which first and second external electrodes 15 and 16 are provided. The first and second external electrodes 15 and 16 are formed by depositing in turn Cr, Cu, Ni and Au by a thin film deposition method such as ion plating or the like. In this preferred embodiment, the total thickness of each of the external electrodes 15 and 16 is about 1 μm. Of course, the first and second external electrodes can be formed by applying an appropriate conductive material by an appropriate method.

As be seen from FIGS. 4A and 4B, the first external electrode 15 is arranged to cover the first side 17a, and electrically connected to the first internal electrodes 7 and the second dummy electrodes 11. The second external electrode 16 is arranged to cover the second side 17b, and electrically connected to the second internal electrodes 10 and the first dummy electrodes 8.

Next, a DC voltage is applied between the external electrodes 15 and 16 to polarize the sintered ceramic compact body 17. In this case, since a DC electric field is applied between the adjacent internal electrodes 7 and 8, the ceramic layers on both sides of each of the internal electrodes 7 or 10 are polarized in opposite directions in the thickness direction.

Figure 1A:
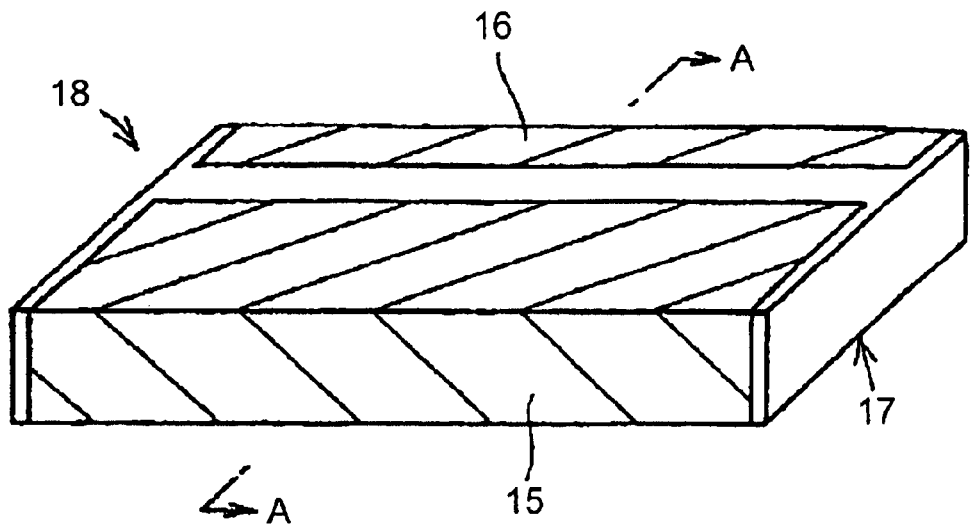
FIG. 1A is a perspective view showing a piezoelectric actuator in accordance with a first preferred embodiment of the present invention.
Figure 1B:
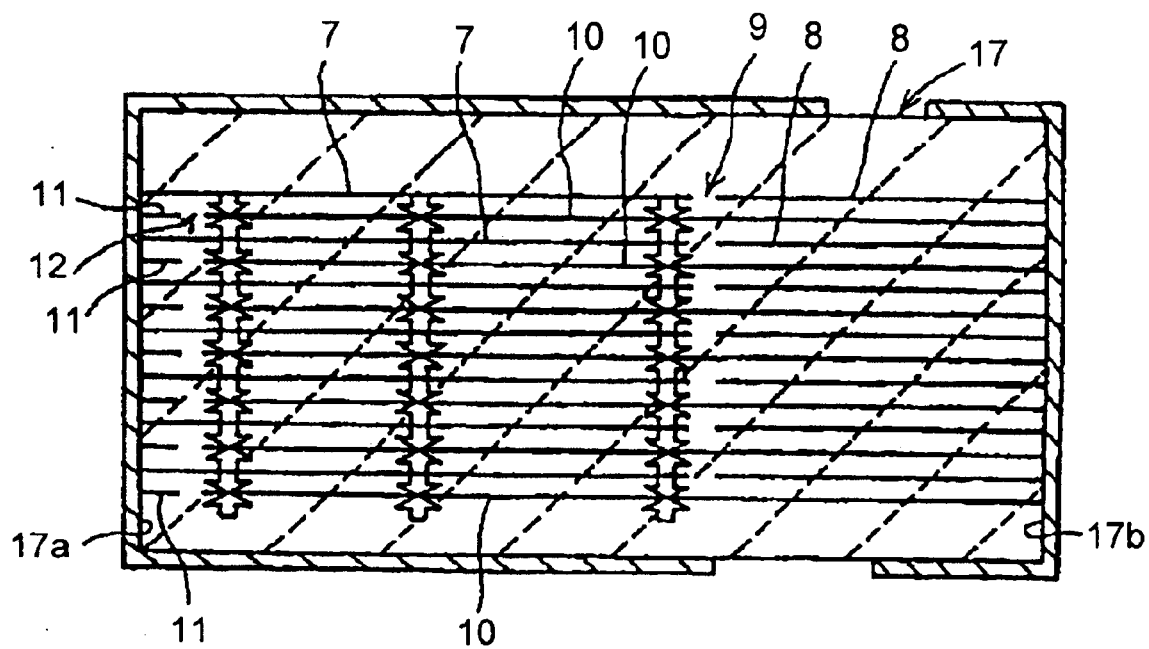
FIG. 1B is a sectional view taken along line A—A in FIG. 1A.

In this way, the piezoelectric actuator 18 of this preferred embodiment shown in FIGS. 1A and 1B is obtained.

In the piezoelectric actuator 18, a voltage is applied between the first and second external electrodes to expand and contract the ceramic layers between the internal electrodes 7 and 11 in the thickness direction due to a piezoelectric effect. Therefore, it is possible to obtain a desired displacement by adjusting the applied voltage.

In addition, the piezoelectric actuator 18 causes small variations in displacement. This is described below.

The first dummy electrodes 8 are respectively formed at the same heights as the first internal electrodes with the gap 9 therebetween, and the second dummy electrodes 11 are respectively formed at the same heights as the second internal electrodes 10 with the gap 12 therebetween. Therefore, in the firing step for obtaining the sintered ceramic compact body 17, a constituent metal of the internal electrodes 7 and 10 tends to diffuse into the ceramic. However, the same constituent metal of the dummy electrodes 8 and 11 also tends to diffuse in the ceramic toward the internal electrodes 7 and 10, suppressing diffusion of the internal electrode constituent metal from the internal electrodes 7 and 10 toward the dummy electrodes 8 and 11. Therefore, the internal electrodes 7 and 10 are maintained in a shape close to a desired shape, thereby minimizing variations in displacement.

Next, an ink jet head including the piezoelectric actuator 18 of this preferred embodiment is described.

Figure 5A:
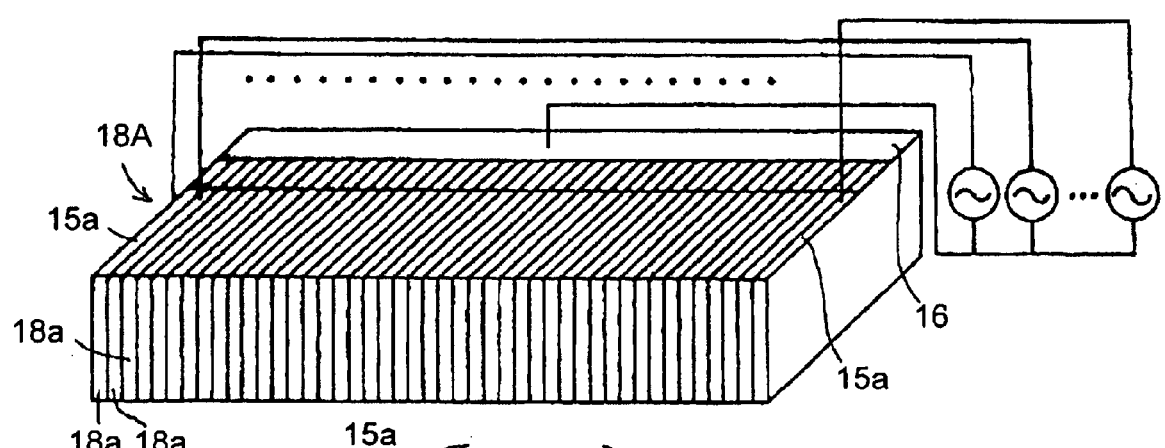
FIG. 5A is a perspective view illustrating a piezoelectric actuator for an ink jet head including a piezoelectric actuator in accordance with the first preferred embodiment.
Figure 5B:
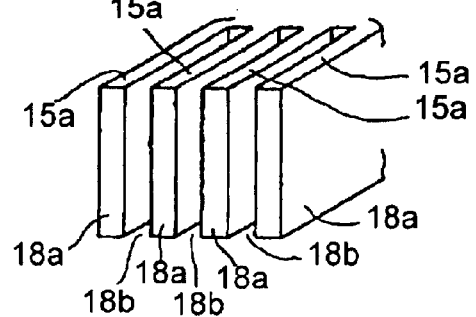
FIG. 5B is an enlarged perspective view showing a principal portion of the piezoelectric actuator shown in FIG. 5A.

FIGS. 5A and 5B are schematic perspective views illustrating an ink jet head including the piezoelectric actuator 18. A plurality of displacement portions 18a are disposed on the side of the piezoelectric actuator 18 where the first external electrode 15 is located. As shown in an enlarged view of FIG. 15B, the plurality of displacement portions 18a are formed by cutting the piezoelectric actuator 18 substantially perpendicularly to the internal electrodes to form displacement portions 18a having a width of about 50 μm. The cut grooves 18b are formed up to a portion near the second external electrode 16. In FIG. 1B, a portion comprising the first and second internal electrodes 7 and 10, which are stacked, functions as a driving portion, and thus each of the displacement portions 18a is arranged to include the driving portion.

Therefore, each of the displacement portions 18a can be displaced independently by applying a signal voltage between the first external electrode 15a present on each of the displacement portions 18a and the second external electrode 16.

Figure 6:
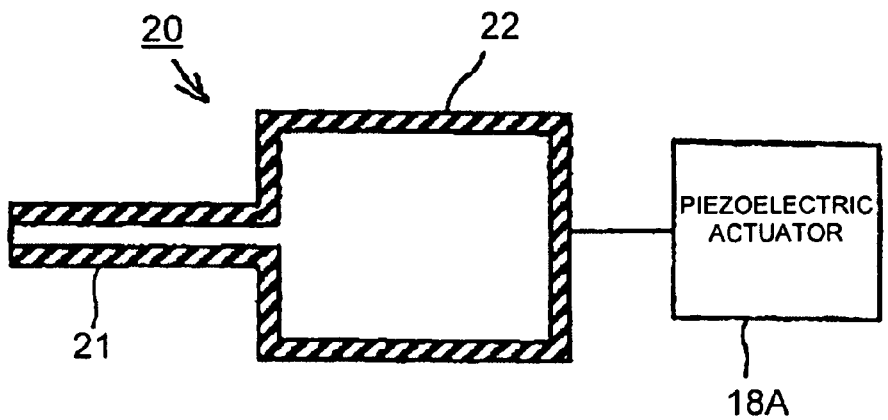
FIG. 6 is a schematic drawing illustrating an ink jet head including a piezoelectric actuator in accordance with the first preferred embodiment.

FIG. 6 is a schematic drawing illustrating the configuration of the ink jet head including the piezoelectric actuator. In the ink jet head 20, an ink chamber 22 is communicated with a nozzle 21 for discharging ink. The ink chamber 22 includes at least a partially flexible wall so that the displacement portions 18a of the piezoelectric actuator 18A are connected to the flexible wall. The displacement portions 18a are displaced by driving the piezoelectric actuator 18A to compress the ink chamber 22, thereby discharging ink.

As the structure of the nozzle 21 and the ink chamber 22, a structure used for conventional ink jet printers can be appropriately used, and the structure is not limited. Furthermore, one displacement portion 18a or a plurality of displacement portions 18a may be connected to one ink chamber 22.

Since the ink jet head 20 of this preferred embodiment includes the piezoelectric actuator 18A which causes less variation in displacement of the displacement portions 18a, application of a predetermined signal voltage permits the precise discharge of a predetermined amount of ink from the ink chamber 22 connected to each of the displacement portions 18a.

Next, the influence of the gaps 9 and 12 on the variations in displacement of the displacement portions 18a of the piezoelectric actuator 18A was confirmed by experiment. The gap 9 or 12 between the internal electrodes 7 and 10 and the dummy electrodes 8 and 11 opposed to the internal electrodes 7 and 10 at the same heights was changed to various values to form a plurality of piezoelectric actuators 18A. Variations in displacement of the plurality of displacement portions 18a in each of the piezoelectric actuators were determined by the following equation:

Variation in displacement of displacement portions={ (displacement of a displacement portion 18a showing maximum displacement−displacement of a displacement portion 18a showing minimum displacement)/(displacement of a displacement portion 18a showing maximum displacement) }×100 (%)

Figure 7:
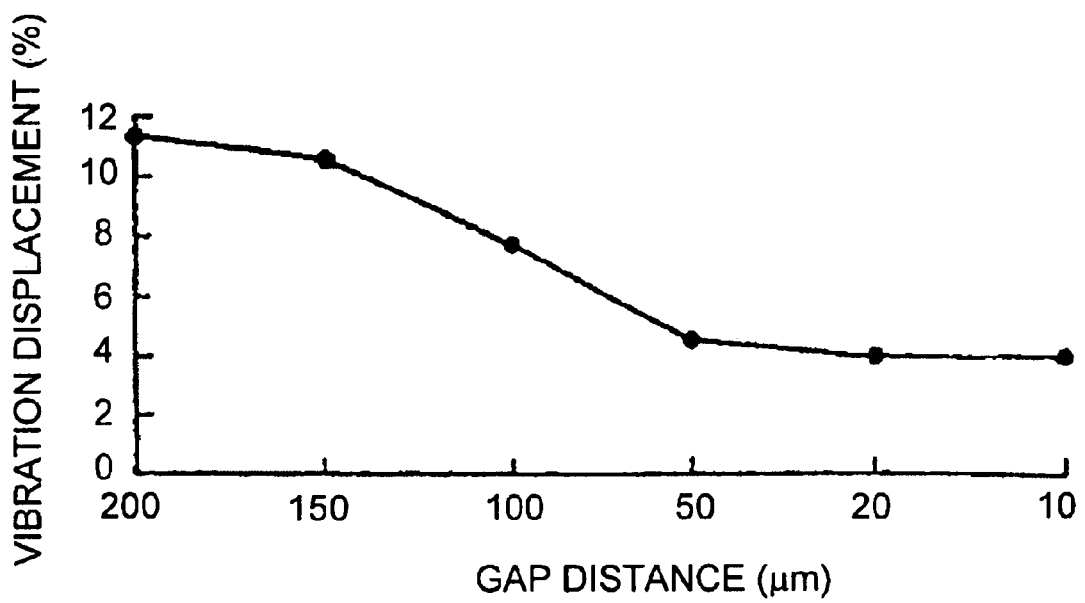
FIG. 7 is a graph showing changes in variation in displacement of a plurality of displacement portions with the gap distance between ends of internal electrodes and dummy electrodes.

The results are shown in FIG. 7.

FIG. 7 indicates that as the gap 9 or 12, i.e., the distance between the ends of the internal electrodes opposite to the ends electrically connected to the external electrodes and the dummy electrodes at the same heights as the internal electrodes, decreases, variations in displacement of the displacement portions 18a decrease. This means that diffusion of the internal electrode constituent metal from the ends of the internal electrodes is effectively suppressed by formation of the dummy electrodes. Since the dummy electrodes 8 and 11 are formed, diffusion of the internal electrode constituent metal during firing is suppressed, and breakage of the internal electrodes is decreased, thereby making uniform the volumes of the displacement portions 18a polarized by applying a voltage in polarization. This also decreases the variations in displacement.

Therefore, in order to maintain the shape of the internal electrodes 7 and 10, the gaps 9 and 12 are preferably as small as possible. Particularly, FIG. 7 indicates that with the gap 9 or 12 of about 100 μm or less, more preferably about 50 μm or less, variations in displacement of the displacement portions 18a can be effectively suppressed.

Of course, where the gap 9 or 12 is smaller than the distance between the internal electrodes adjacent in the thickness direction, dielectric breakdown readily occurs in polarization in the thickness direction. Therefore, the gaps 9 and 12 are preferably above the distance between the internal electrodes adjacent in the thickness direction.

Figure 8:
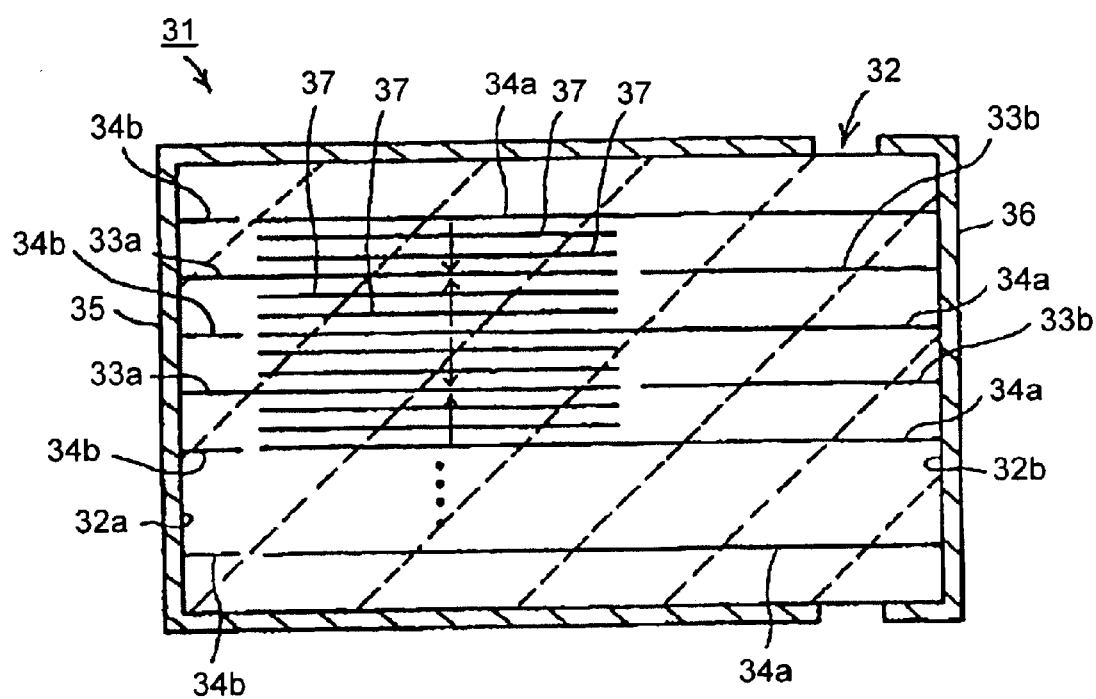
FIG. 8 is a sectional view illustrating a piezoelectric actuator in accordance with a second preferred embodiment of the present invention.

FIG. 8 is a sectional view showing a piezoelectric actuator in accordance with a second preferred embodiment of the present invention.

In the piezoelectric actuator 18 of the first preferred embodiment, the dummy electrodes 8 and 11 are respectively formed at the same heights as the internal electrodes 7 and 10 in the sintered ceramic compact body 17. However, in the present invention, besides the dummy electrodes, floating electrodes may be provided between the internal electrodes to decrease variations in displacement.

The piezoelectric actuator 31 shown in FIG. 8 includes a sintered ceramic compact body 32 made of piezoelectric ceramic such as lead titanate zirconate or the like. In the sintered ceramic compact body 32, first and second internal electrodes 33a and 34a are stacked to overlap each other. The first internal electrodes 33a are extended to the first side 32a of the sintered ceramic compact body 32 and the second internal electrodes 34a are extended to the second side 32b opposite to the first side 32a.

Like in the first preferred embodiment, dummy electrodes 33b and 34b are respectively formed at the same heights as the first and second internal electrodes 33a and 34a.

A first external electrode 35 is arranged to cover the first side 32a; a second external electrode is arranged to cover the second side 32b. In addition, floating electrodes 37 are arranged between the internal electrodes 33a and 34a so as not to be electrically connected to the external electrodes 35 and 36.

Each of the ceramic layers between the internal electrodes 33a and 34a is polarized as shown by an arrow in FIG. 8. Like in the first preferred embodiment, the ceramic layers on both sides of each of the internal electrodes are polarized in opposite directions.

Therefore, a voltage is applied between the external electrodes 35 and 36 to expand and contract the ceramic layers between the internal electrodes 33a and 34a in the thickness direction, thereby operating the piezoelectric actuator.

In the piezoelectric actuator 31 of this preferred embodiment, the presence of the dummy electrodes 33b and 34b suppresses the horizontal diffusion of the internal electrode constituent metal from the internal electrodes 33a and 34a during firing for obtaining the sintered ceramic compact body 32. In addition, since the floating electrodes 37 are stacked between the internal electrodes 33a and 34a, the diffusion of the internal electrode constituent metal from the internal electrodes 33a and 34a in the thickness direction is also suppressed during firing for obtaining the sintered ceramic compact body 32. Although the internal electrode constituent metal which constitutes the internal electrodes 33a and 34a tends to diffuse to the ceramic side during firing, a floating electrode constituent metal also tends to diffuse from the floating electrodes 37 in the thickness direction, suppressing diffusion of the internal electrode constituent metal from the internal electrodes 33a and 34a.

Therefore, the shape of the internal electrodes is maintained to the design values, and thus variations in displacement can be decreased as compared with a conventional piezoelectric actuator. However, in order to obtain a large displacement, it is necessary to decrease the thickness of the ceramic layers between the internal electrodes 33a and 34a. Therefore, the piezoelectric actuator 31 of this preferred embodiment including the floating electrodes 37 can produce only a small displacement, and thus it is suitable for application which requires precision of displacement.

Furthermore, the floating electrodes 37 may be arranged in the ceramic layers outside the outermost internal electrodes 33a and 34a in the stacking direction. In this case, it is possible to suppress the outward diffusion of the internal electrode constituent metal from the outermost internal electrodes 33a and 34a in the stacking direction.

The floating electrodes 37 are provided for suppressing the diffusion of the internal electrode constituent metal in the stacking direction of the internal electrodes. Therefore, where the floating electrode 37 is arranged in at least one ceramic layer of the ceramic layers between the internal electrodes and the ceramic layers outside the outermost internal electrodes in the stacking direction, it is possible to suppress the diffusion of the internal electrode constituent metal from the internal electrodes opposed to the floating direction in the thickness direction. Namely, the floating electrodes are not necessarily formed in the ceramic layers between the internal electrodes and the ceramic layers outside the outermost internal electrodes in the stacking direction.

Although not shown in the drawing, the floating electrodes 37, which are used in the piezoelectric actuator 31 of the second preferred embodiment, may be combined with the piezoelectric actuator 18 of the first preferred embodiment, for suppressing diffusion of the internal electrode constituent metal from the internal electrodes 7 and 11 in the thickness direction. This can further decrease variations in displacement.

In the piezoelectric actuator 31 of the second preferred embodiment, the dummy electrodes 33b and 34b are not necessarily provided. In this case, sine the floating electrodes 37 are formed, it is possible to suppress the diffusion of the internal electrode constituent metal in the thickness direction from the ends of the internal electrodes 33a and 34a, which are not connected to the external electrodes.

As described above, in the piezoelectric actuator of preferred embodiments of the present invention, the dummy electrodes are provided between the ends of the internal electrodes, which are opposed to the ends connected to one of the external electrodes, and the external electrode not connected to the internal electrodes at the same heights where the internal electrodes are respectively formed in the sintered ceramic compact body. Therefore, the presence of the dummy electrodes suppresses the diffusion of the internal electrode constituent metal to ceramic during firing, thereby suppressing undesirable phenomena such as breakage of the internal electrodes. Thus, the internal electrodes are formed in a shape close to a desired shape having design values, to provide a piezoelectric actuator producing less variation in displacement.

In the piezoelectric actuator in which the floating electrodes are arranged, the presence of the floating electrodes suppresses the diffusion of the internal electrode constituent metal in the thickness direction to further suppress breakage of the internal electrodes, thereby more effectively decreasing variations in displacement.

In the above-described piezoelectric actuator, where the gap distance between the dummy electrode-side ends of the internal electrodes and the dummy electrodes is 100 µm or less, the diffusion of the internal electrode constituent metal from the internal electrodes to the dummy electrode side is more effectively suppressed, providing a piezoelectric actuator producing very small variations in displacement.

In the piezoelectric actuator of the present invention, where at least one floating electrode layer is arranged in at least one of the ceramic layers between the internal electrodes and/or the ceramic layers outside the outermost internal electrodes in the stacking direction, the presence of the floating electrodes suppresses the diffusion of the internal electrode constituent metal from the internal electrodes to the floating electrode side to suppress undesirable phenomena such as breakage of the internal electrodes. Thus, the internal electrodes can be formed according to design values, to provide a piezoelectric actuator producing small variations in displacement.

The method of manufacturing the piezoelectric actuator of the present invention comprises stacking green sheets on each of which an internal electrode and dummy electrode are printed, and then firing the resultant layered product to obtain a sintered ceramic compact body. Therefore, during firing, the internal electrode constituent metal less diffuses to the dummy electrode side due to the presence of the dummy electrodes. It is thus possible to securely form the internal electrodes in a shape close to a shape having design value, thereby decreasing variations in displacement of the piezoelectric actuator.

In the method of manufacturing the piezoelectric actuator comprising stacking green sheets, on each of which a floating electrode is printed, so that the floating electrodes are located between internal electrodes or outside the outermost internal electrodes, the presence of the floating electrodes suppresses the diffusion of the internal electrode constituent metal to the floating electrode side, i.e., in the thickness direction. It is thus possible to provide a piezoelectric actuator producing less variations in displacement.

Since the ink jet head of the present invention comprises the piezoelectric actuator of the present invention, which produces small variations in displacement, a desired amount of ink can be precisely discharged from the ink chamber through the nozzle by driving the piezoelectric actuator. Therefore, it is possible to provide an ink jet head exhibiting high precision of ink discharge and excellent reliability.

A method of manufacturing a multilayer piezoelectric resonator in accordance with a third embodiment of the present invention, and the structure of the multilayer piezoelectric resonator are described below with reference to FIGS. 9A to 25.

First, ceramic slurry composed of a lead titanate zirconate piezoelectric ceramic powder as a main component is prepared. A sheet is formed by a doctor blade method using the slurry to obtain a green sheet having a thickness of 20 to 100 µm. The thus-obtained green sheet is punched in a rectangular shape to obtain a green sheet having a rectangular planar shape.

Then, conductive paste such as Ag—Pd paste is screen-printed on one side of the rectangular green sheet, and dried to print an internal electrode pattern. Similarly, conductive paste is screen-printed on one side of another rectangular green sheet, and dried to form a floating electrode pattern.

The green sheet on which the internal electrode pattern is printed is referred to as a "first green sheet"; the green sheet on which the floating electrode pattern is printed is referred to as a "second green sheet".

Figure 10:
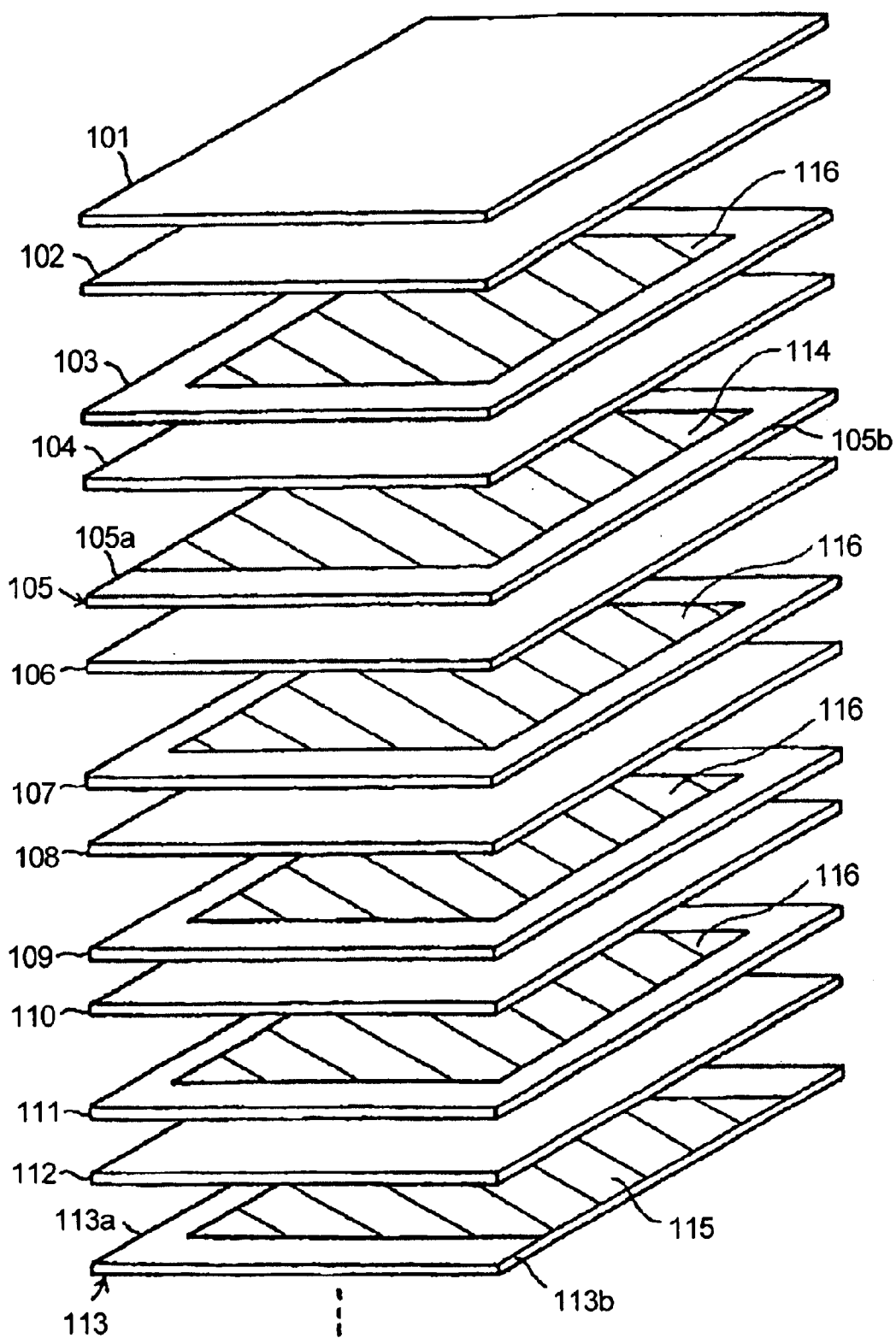
FIG. 10 is an exploded perspective view showing green sheets and electrode patterns formed thereon which are used for manufacturing the multilayer piezoelectric resonator of the third preferred embodiment.

Next, the first and second green sheets are stacked together with rectangular green sheets with no electrode pattern printed thereon, as shown in FIG. 10. FIG. 10 shows only the upper portions of the stacked green sheets. FIG. 10 shows green sheets 101 to 113 including the first green sheets 105 and 113 on which internal electrodes 114 and 115, respectively, are printed.

The internal electrode pattern 114 is formed up to one edge 105a of the green sheet 105, but it does not contact the other edge 105b opposite to the edge 105a. The internal electrode pattern 115 is formed on the upper side of the green sheet 113 so that the internal electrode pattern 115 does not contacts the edge 113a which overlaps with the edge 105a of the green sheet 105 after stacking, but it contacts the other edge 113b.

The green sheets 103, 107, 109 and 111 are the second green sheets on each of which a floating electrode pattern 116 is formed. The unpatterned green sheets 104, 106, 108, 110 and 112 on which no electrode pattern is printed are inserted between the first and second green sheets. In order to form the uppermost layers of the layered product, the unpatterned ceramic green sheets 101 and 102 are provided in the uppermost portion.

Figure 11A:
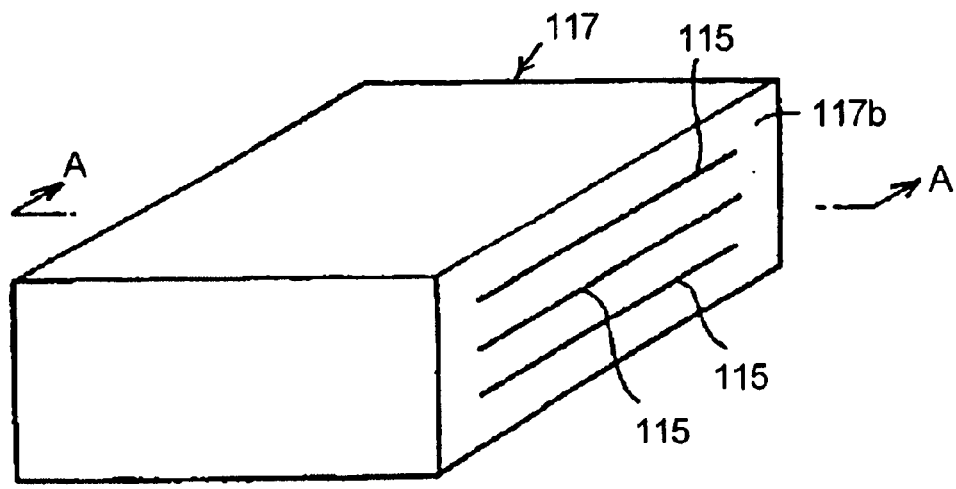
FIG. 11A is a perspective view showing a layered product prepared according to the third preferred embodiment.
Figure 11B:
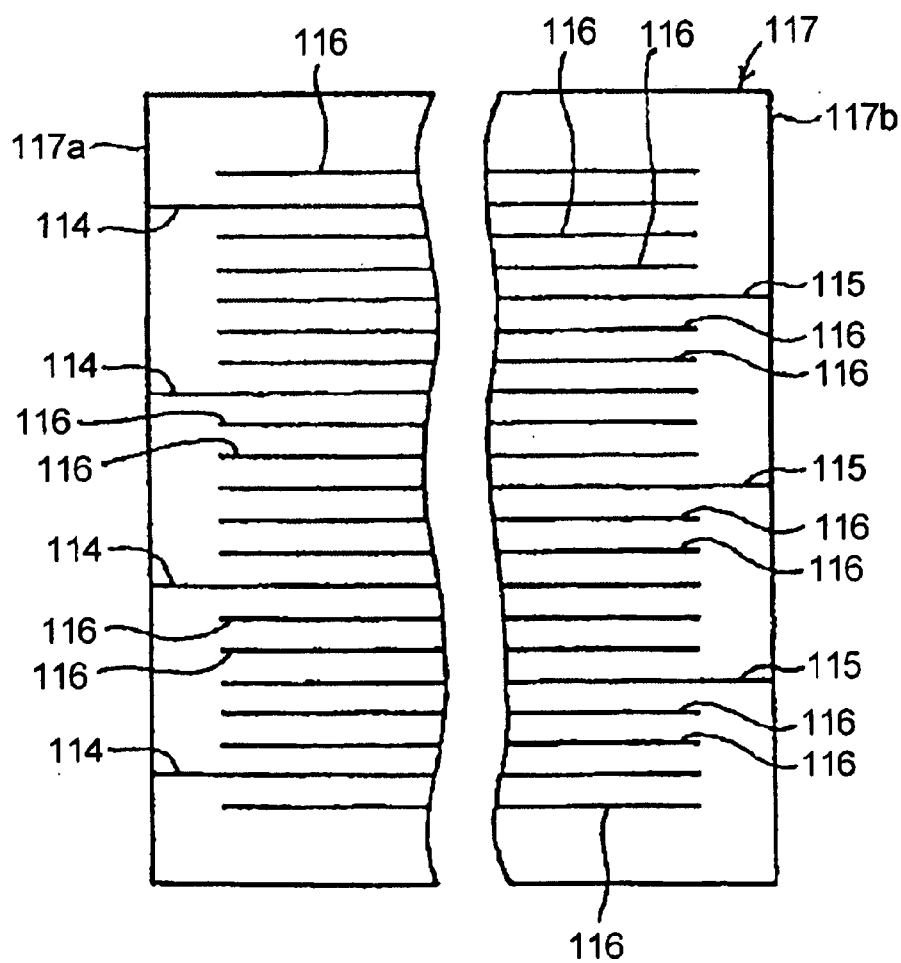
FIG. 11B is a sectional view taken along line A—A in FIG. 11A.

The first and second green sheets, and the unpatterned ceramic green sheets are stacked in the above-mentioned order, and an appropriate number of unpatterned ceramic green sheets are stacked in the lowermost portion, followed by compression in the thickness direction to obtain the layered product shown in FIGS. 11A and 11B. FIG. 11B is a sectional view taken along line A—A in FIG. 11A, in which a section shown by hatching is omitted.

As shown in FIG. 11B, in a layered product 117, a plurality of the internal electrodes 114 and 115 are led to the side 117a and 117b of the layered product 117 alternately in the thickness direction (the stacking direction) of the layered product 117. The floating electrode patterns 116 are not exposed from the sides of the layered product 117.

Next, the layered product 117 is burned at a temperature of 1000 to 1200° C. for several hours to obtain a mother sintered compact.

Figure 12A:
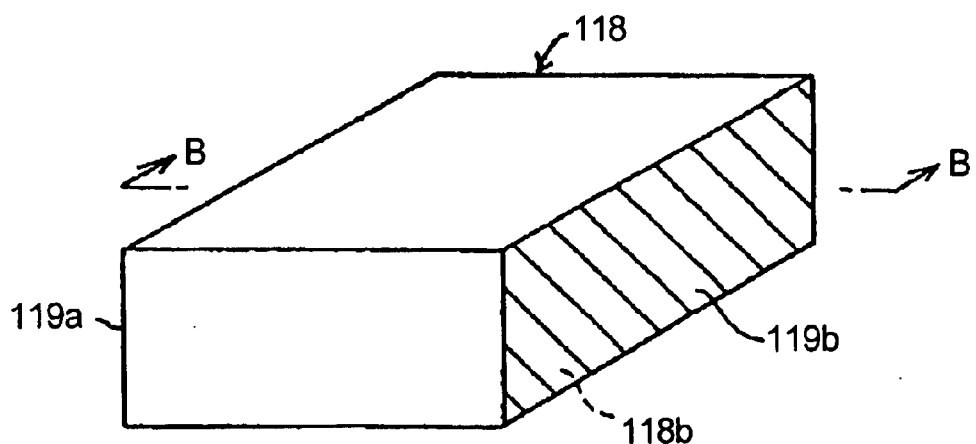
FIG. 12A is a perspective view showing a mother sintered ceramic compact body prepared according to the third preferred embodiment.
Figure 12B:
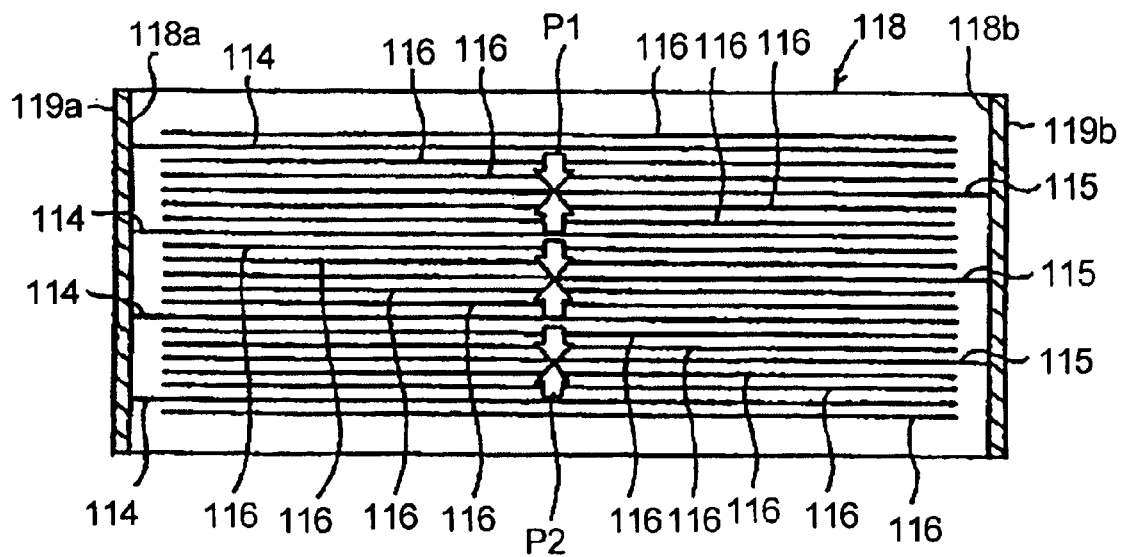
FIG. 12B is a sectional view taken along line B—B in FIG. 12A.

The mother sintered compact shown in FIG. 12A is obtained as described above. Ag—Pd paste is coated to cover a pair of opposite sides 118a and 118b of the mother sintered compact 118, and then baked, or Ag is deposited by vapor deposition or sputtering to form polarization electrodes 119a and 119b.

A DC voltage is applied between the polarization electrodes 119a and 119b to polarize the mother sintered compact 118. In this case, in the mother sintered compact 118, a DC electric field is applied between the adjacent internal electrode patterns 114 and 115 to polarize the sintered compact 118 as shown by arrows in FIG. 12B. Namely, the ceramic layers between the internal electrodes 114 and 115 are polarized in the thickness direction, but the ceramic layers on both sides of each of the internal electrodes 114 and 115 are polarized in opposite directions in the thickness direction.

The floating electrodes 116 are arranged in parallel with the internal electrodes 114 and 115, and are not electrically connected to the polarization electrodes 119a and 119b, thereby producing no influence on polarization.

Next, after polarization, the upper side and/or the lower side of the mother sintered ceramic compact body 118 is ground to a predetermined thickness. Namely, since the antiresonance frequency of the finally obtained multilayer piezoelectric resonator is determined by the thickness, i.e., the dimension in the stacking direction of the internal electrodes 114 and 115, the mother sintered ceramic compact body 118 is ground to obtain a desired resonance frequency.

Figure 13:
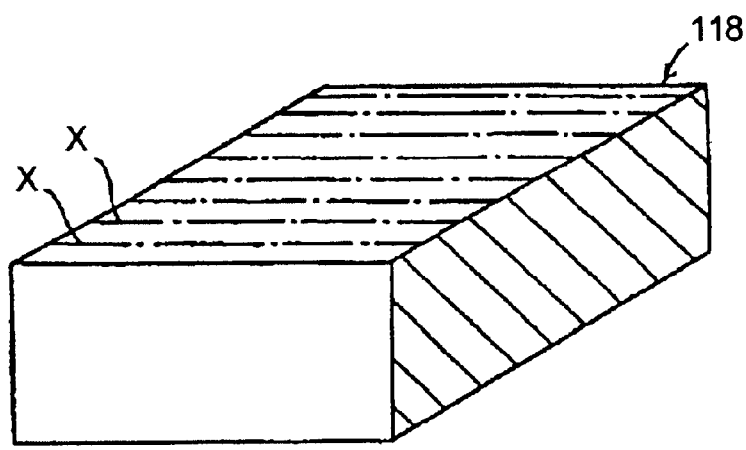
FIG. 13 is a perspective view illustrating the step of cutting a mother sintered ceramic compact body.
Figure 14:
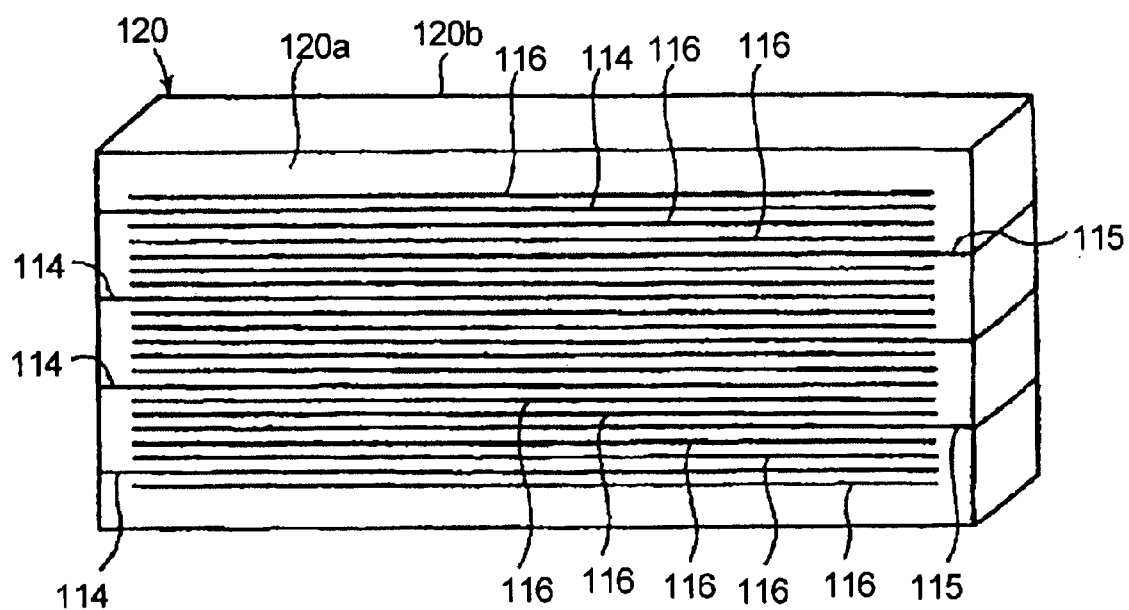
FIG. 14 is a perspective view illustrating a sintered compact block obtained by cutting a mother sintered compact.

Next, the mother sintered ceramic compact body 118 is cut by using a dicer perpendicularly to the internal electrode patterns 114 and 115, as shown by broken lines X in FIG. 13. By cutting, the sintered block 120 shown in FIG. 14 is obtained.

Figure 15:
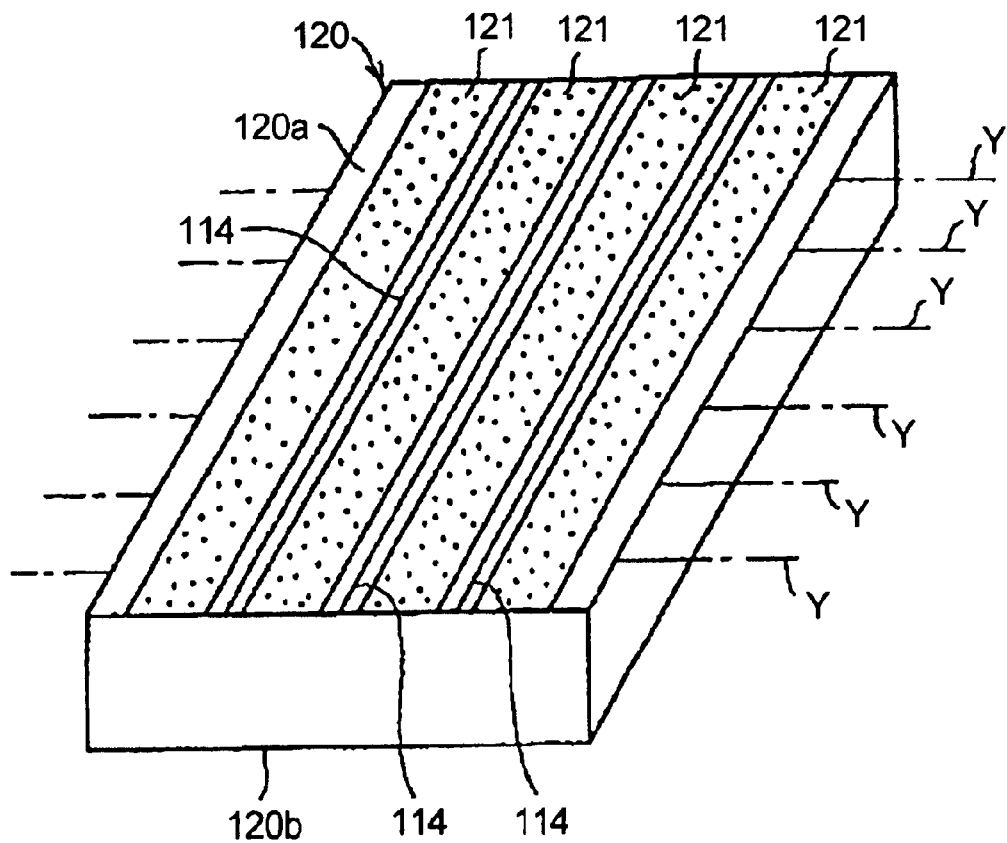
FIG. 15 is a perspective view showing a state in which insulating films are formed on a sintered compact block.

Next, an insulating material such as an epoxy resin or the like is coated on the opposite sides 120a and 120b of the thus-obtained sintered block 120 to form a plurality of insulating films 121 (FIG. 15). These insulating films 121 are formed on the side 120a of the sintered block 120 to cover the exposed portions of the floating electrode patterns 116 and the exposed portions of the internal electrode patterns 115. Although not shown in FIG. 15, similarly, the insulating films 121 are formed on the other side 120b of the sintered block 120 to cover the exposed portions of the floating electrode patterns 116 and the exposed portions of the internal electrode patterns 114 which are not coated with the insulating films on the side 120a.

The insulating material used for forming the insulating films is not limited to epoxy resins, and appropriate insulating resin materials having insulating properties and finally curable can be used.

Next, Monel and Ag are sputtered in turn to a thickness of about 1 μm over the entire surfaces of the sides 120a and 120b of the sintered block 120 to form mother external electrodes. The sintered block 120 is then cut in the direction along one-dot chain lines Y in FIG. 15, i.e., cut perpendicularly to the internal electrode patterns 114 and 115, to obtain the multilayer piezoelectric resonator of this embodiment shown in FIGS. 9A and 9B.

Figure 9A:
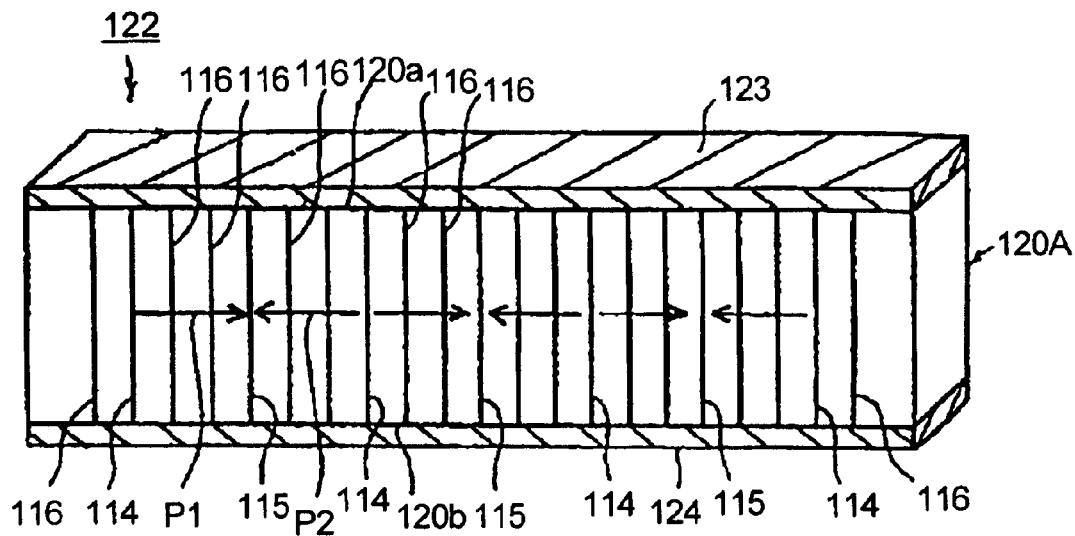
FIGS. 9A and 9B are a perspective view and a longitudinal sectional view, respectively, showing a multilayer piezoelectric resonator in accordance with a third preferred embodiment of the present invention.
Figure 9B:
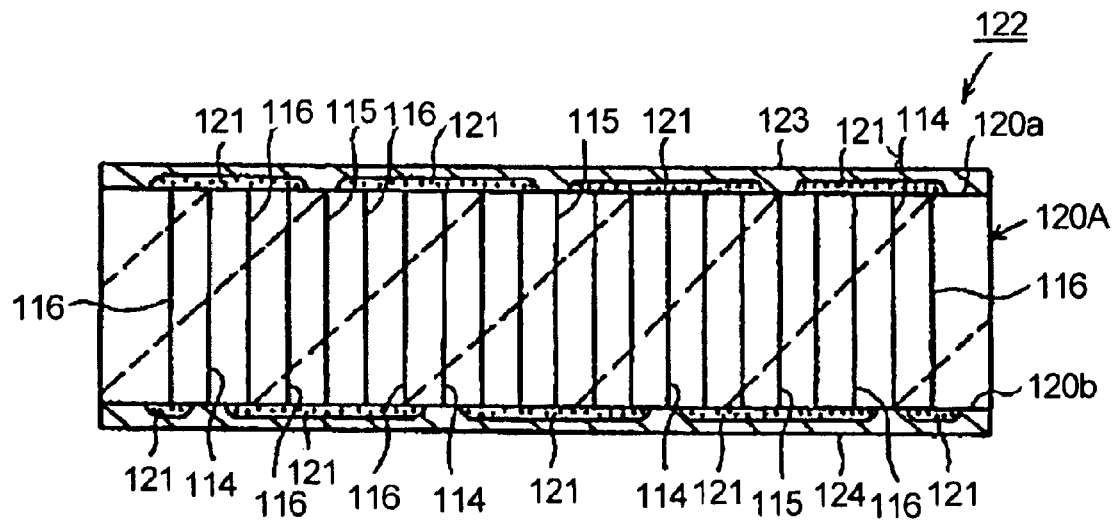

As shown in FIGS. 9A and 9B, a multilayer piezoelectric resonator 122 of this embodiment comprises a sintered ceramic compact body 120A obtained by cutting the sintered block 120. In addition, the above-described mother external electrodes are cut to form first and second external electrodes 123 and 124 on the opposite first and second sides 120a and 120b, respectively, of the sintered ceramic compact body 120A. Furthermore, the insulating films 121 are formed below the external electrodes 123 and 124. In order to facilitate understanding, the internal electrodes and floating electrodes of the multilayer piezoelectric resonator 122 are denoted by the same reference numerals as the internal electrode patterns 114 and 115 and the floating electrode patterns 116 of the mother sintered compact.

As be seen from FIG. 9B, the internal electrodes 114 and 115, and the floating electrodes 116 are formed to contact the opposite first and second sides 120a and 120b of the sintered ceramic compact body 120A. Of course, the exposed end portions of the internal electrodes 114 and 115 are coated with the insulating films 121. Namely, the portions of the internal electrodes 114 exposed from the first side 120a are coated with the insulating films 121; the portions of the internal electrodes 115 exposed from the second side 120b are coated with the insulating films 121. Similarly, both exposed ends of the floating electrodes 116 are coated with the insulating films 121.

Therefore, the internal electrodes 114 are not electrically connected to the first external electrode 123 but electrically connected to the second external electrode 124. The internal electrodes 115 are electrically connected to the first external electrode 123 but not electrically connected to the second external electrode 124. The floating electrodes 116 are not electrically connected to both external electrodes 123 and 124.

Therefore, an AC voltage is applied between the external electrodes 123 and 124 of the multilayer piezoelectric resonator 122 to polarize the piezoelectric ceramic layers between the internal electrodes 114 and 115 in the directions shown by arrows P1 and P2 (FIG. 9A), thereby exciting thickness longitudinal vibration.

Since the multilayer piezoelectric resonator 122 has a rod-like shape which is relatively long in the stacking direction of the internal electrodes 114 and 115, and the ceramic layers between the internal electrodes 114 and 115 are expanded and contracted in the stacking direction by applying a voltage, the multilayer piezoelectric resonator 122 is excited as a whole in a longitudinal vibration basic mode in application of a voltage, thereby obtaining intended resonance characteristics.

In the multilayer piezoelectric resonator of this embodiment, the floating electrodes 116 are present between the internal electrodes 114 and 115, which contribute to excitation, and present outside the outermost internal electrodes 114 and 115 in the stacking direction. Namely, in regard to each of the internal electrodes 114, the floating electrodes 116 are present on both sides of each internal electrode 114. Similarly, the floating electrodes 116 are also present on both sides of each of the internal electrodes 115.

In the firing step for obtaining the mother sintered ceramic compact body 120, Ag which constitutes the internal electrode patterns 114 and 115 tends to diffuse, but Ag also tends to diffuse from the floating electrodes 116. Therefore, Ag diffusion from the internal electrodes 114 is suppressed by the presence of the floating electrode patterns 116 on both sides in the thickness direction, thereby securely forming the internal electrodes 114 and 115 having the desired shape. Thus, the areas of the internal electrodes 114 and 115 are less decreased due to the diffusion of the internal electrode constituent metal, and precision of the formation of the internal electrodes 114 and 115 is improved, thereby causing less decrease in a frequency difference ΔF between the resonance frequency and the antiresonance frequency, and significantly decreasing variations in resonance characteristics.

On the basis of experimental examples, description will now be made of the phenomenon that in the multilayer piezoelectric resonator 122 of this embodiment, the presence of the floating electrodes 116 increases the frequency difference ΔF and decreases variations in resonance frequency.

Figure 16:
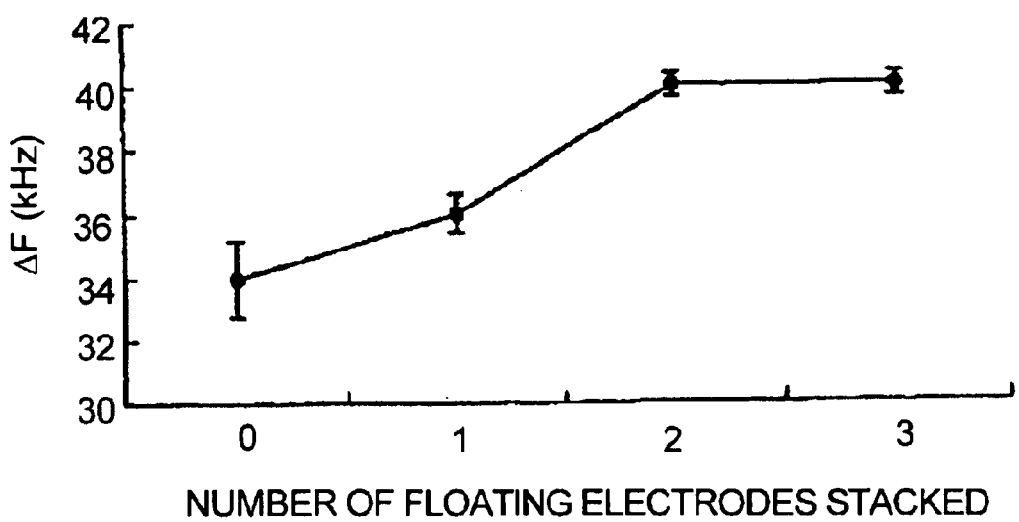
FIG. 16 is a graph showing changes in frequency difference ΔF with changes in the number of the floating electrodes stacked in the multilayer piezoelectric resonator of the third preferred embodiment.

FIG. 16 is a graph showing changes in the frequency difference ΔF with changes in the number of the floating electrodes arranged between internal electrodes in manufacturing the multilayer piezoelectric resonator 122 of this embodiment. The number of the floating electrodes stacked means the number of the floating electrodes inserted between the adjacent internal electrodes in the thickness direction. The number of the floating electrodes inserted in each of the ceramic layers outside the outermost internal electrodes in the stacking direction is one.

FIG. 16 indicates that as the number of the floating electrodes stacked increases, the frequency difference ΔF increases.

Figure 17:
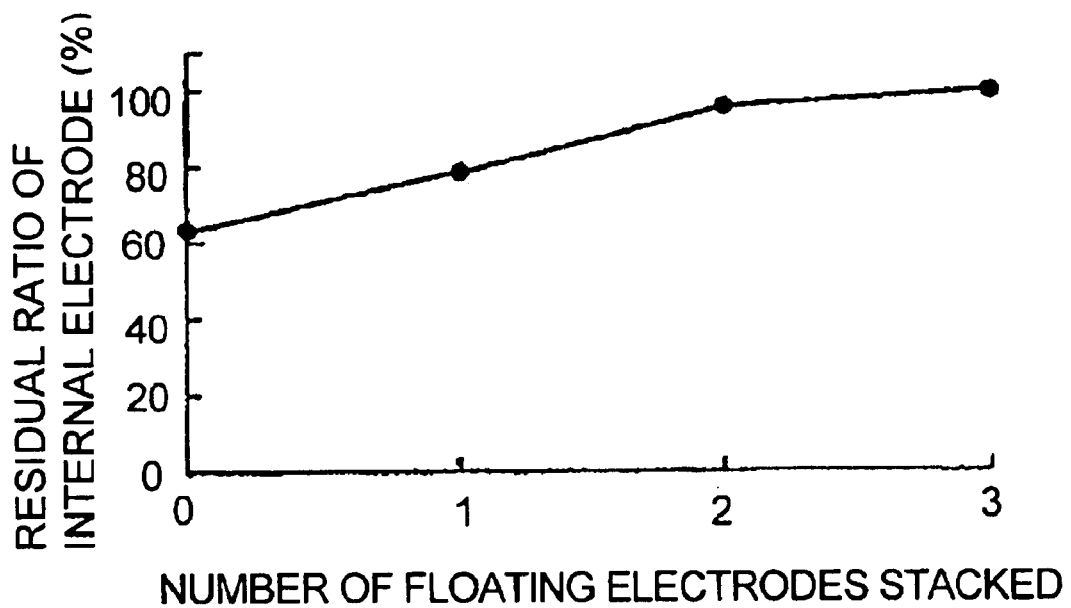
FIG. 17 is a graph showing changes in the residual ratio of internal electrodes with changes in the number of the floating electrodes stacked in the multilayer piezoelectric resonator of the third preferred embodiment.

FIG. 17 is a graph showing the relation between the number of the floating electrodes stacked and the residual ratio of the internal electrodes. The residual ratio of the internal electrodes means the ratio of the measured residual internal electrode area to the design area value of the internal electrodes on the assumption that the area ratio of internal electrodes formed according to design values after cutting the obtained multilayer piezoelectric resonator and then grinding the sections thereof is 100%. The residual ratio of the internal electrodes is an average of the residual ratios of all internal electrodes in the multilayer piezoelectric resonator 122.

FIG. 17 indicates that as the number of the floating electrodes stacked increases, the residual ratio of the internal electrodes increases.

Particularly, FIGS. 16 and 17 reveal that with a number of the floating electrodes stacked of 2 or more, the frequency difference ΔF and the residual ratio of the internal electrodes are further increased, thereby more effectively increasing the frequency difference ΔF and decreasing variations in resonance characteristics.

A multilayer piezoelectric resonator in accordance with a fourth embodiment of the present invention is described with reference to FIGS. 18 to 25.

First, ceramic slurry composed of a lead titanate zirconate piezoelectric ceramic powder as a main component is prepared for obtaining a rectangular green sheet. Then, conductive paste such as Ag—Pd paste is printed on the rectangular green sheet to obtain a first green sheet on which an internal electrode-dummy electrode pattern is printed. Similarly, conductive paste is screen-printed on another rectangular green sheet, and dried to obtain a second green sheet on which a floating electrode pattern is printed. The thus-obtained first and second green sheets and unpatterned green sheets with no electrode pattern printed thereon are stacked.

Figure 19:
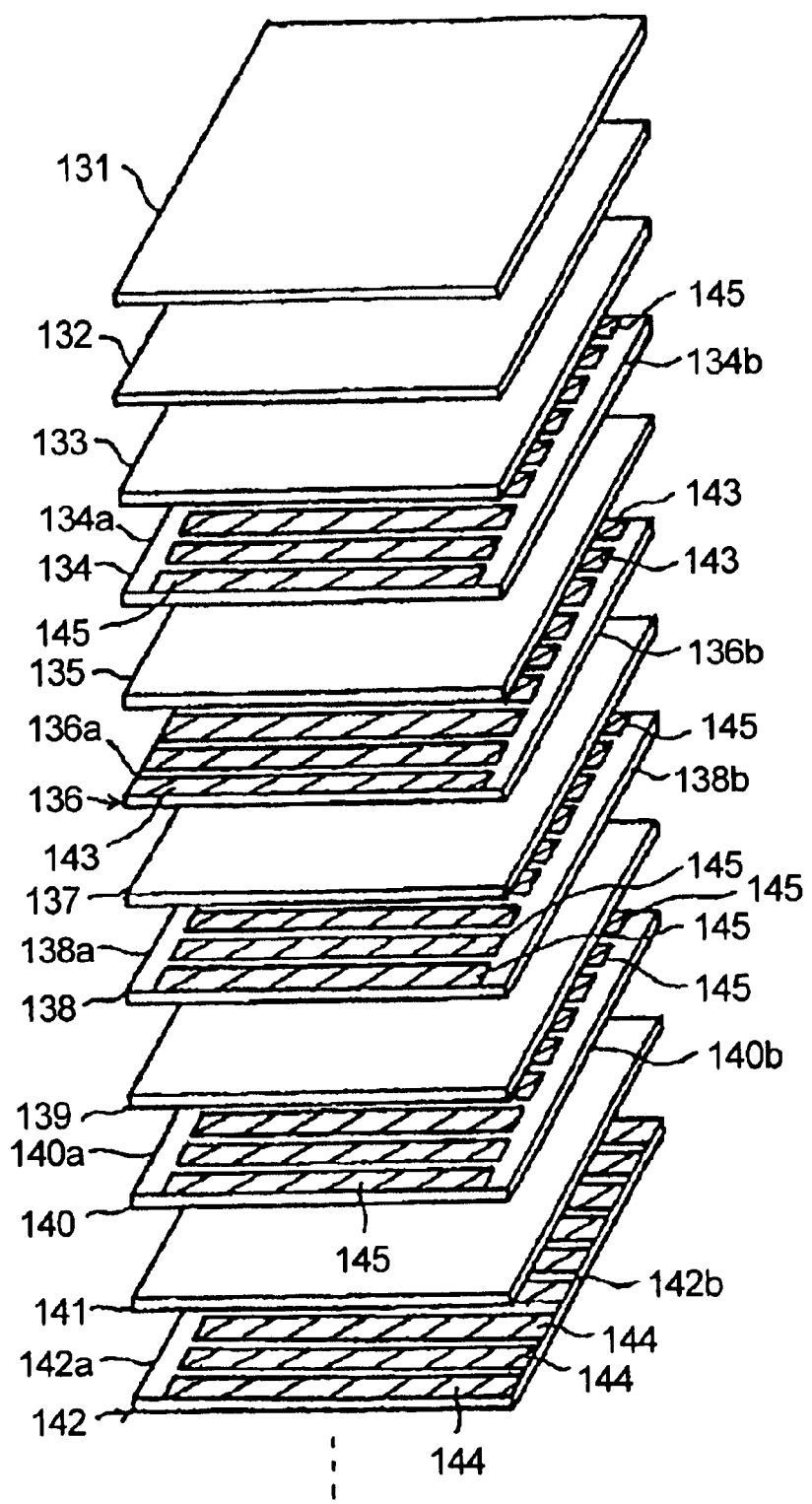
FIG. 19 is an exploded perspective view illustrating green sheets and electrode patterns formed thereon which are prepared for manufacturing the fourth preferred embodiment.

The method of stacking the plurality of green sheets will be described with reference to FIG. 19. FIG. 19 shows green sheets 131 to 142 which constitutes an upper stacked portion. Of these green sheets, the first green sheets 136 and 142 are the first green sheets on which internal electrode-dummy electrode patterns 143 and 144, respectively, comprising a plurality of parallel stripes are formed.

On the other hand, the green sheets 134, 138 and 140 are the second green sheets on which floating electrode patterns 145 are respectively formed. Each of the floating electrode patterns 145 comprises a plurality of parallel stripes. The floating electrode patterns 145 are formed so that both ends of each of the stripes do not contact the edges 134a and 134b, 138a and 138b, or 140a and 140b.

The internal electrode-dummy electrode pattern 143 is formed so that it contacts one edge 136a of the green sheet 136 but does not contact the other edge 136b. The internal electrode-dummy electrode pattern 144 is formed so that it does not contact the edge 142a of the green sheet 142 which is overlapped with the edge 136a of the green sheet 136 but contacts the other edge 142b.

Therefore, the two floating electrode patterns 145 are arranged between the internal electrode-dummy electrode patterns 143 and 144. In the upper stacked portion, one floating electrode pattern 145 is arranged outside the outermost internal electrode-dummy electrode pattern 143 in the stacking direction. Each of the unpatterned green sheets 135, 137, 139 and 141 is inserted between the first and second green sheets or between the second green sheets, and the unpatterned green sheets 131 to 133 are used for forming the outermost layer of the layered product.

Figure 20:
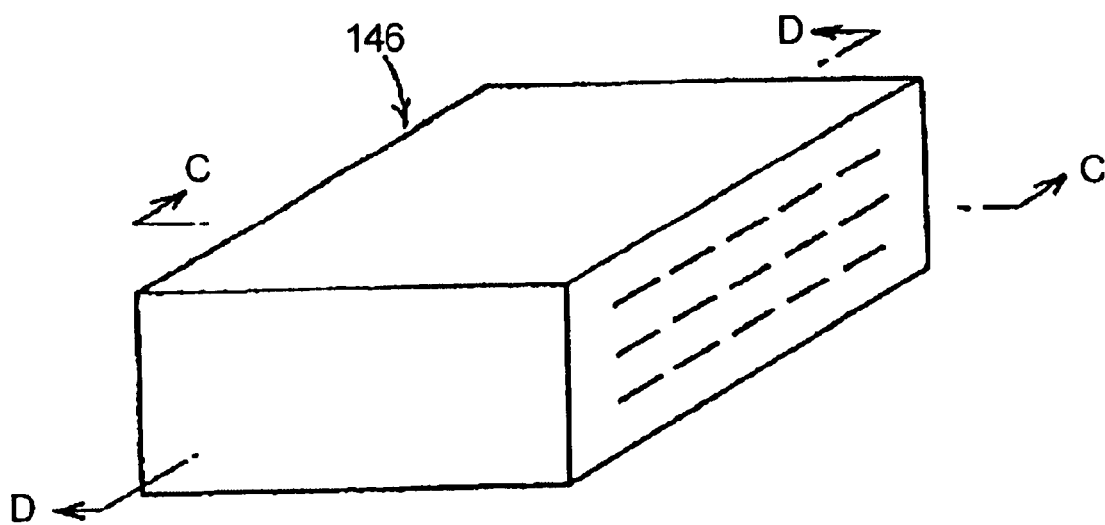
FIG. 20 is a perspective view showing a layered product prepared in the fourth preferred embodiment.
Figure 21A:
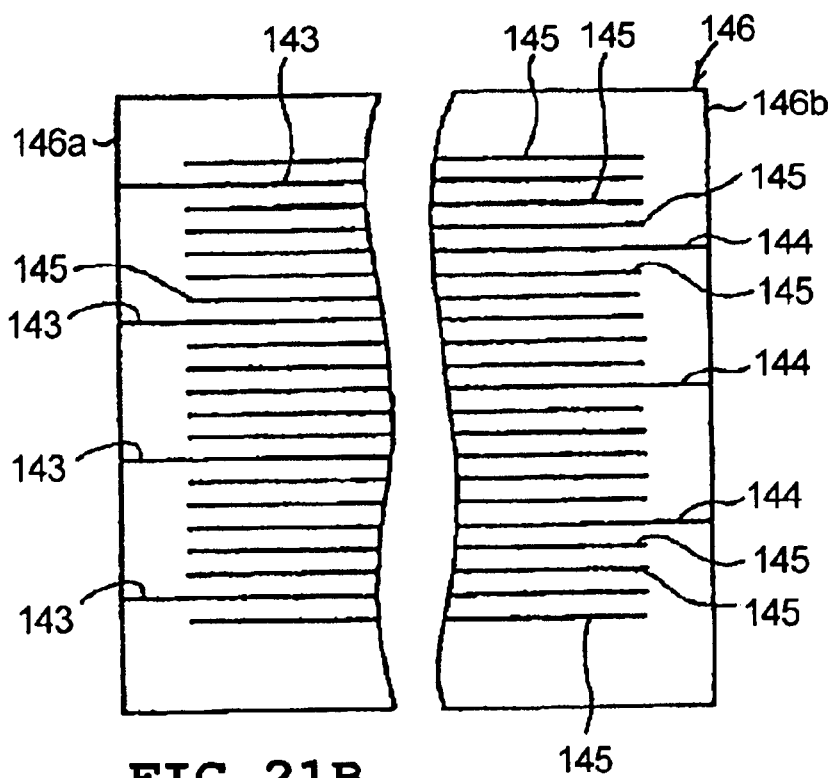
FIGS. 21A and 21B are sectional views taken along lines C—C and D—D, respectively, in FIG. 20.
Figure 21B:
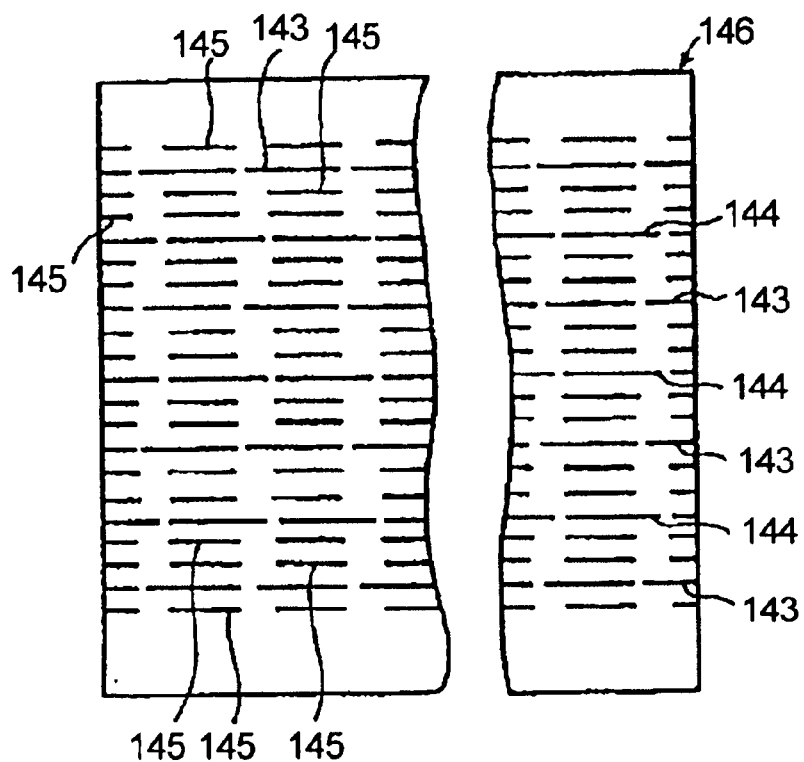

The green sheets are stacked in the above-mentioned order, and unpatterned ceramic green sheets are stacked in the lowermost portion, followed by compression in the thickness direction to obtain the layered product 146 shown in FIG. 20. FIGS. 21A and 21B are sectional views taken along lines C—C and D—D, respectively, in FIG. 20.

As shown in FIGS. 21A and 21B, in the section taken along line C—C, the floating electrode patterns 145 are not exposed from a pair of opposite sides 146a and 146b of the layered product 146.

On the other hand, the internal electrode-dummy electrodes 143 and 144 are exposed from the first and second sides 146a and 146b.

In the section taken long line D—D, the stripes which constitutes the floating electrode patterns 145 are arranged to overlap with each other in the thickness direction. Of course, the stripes which constitute the internal electrode-dummy electrode pattern 143 arranged to be shifted from the stripes which constitute the internal electrode-dummy electrode pattern 144 in the thickness direction.

Next, the layered product 146 is burned at a temperature of 1000 to 1200° C. for several hours to obtain a mother sintered compact.

Figure 22A:
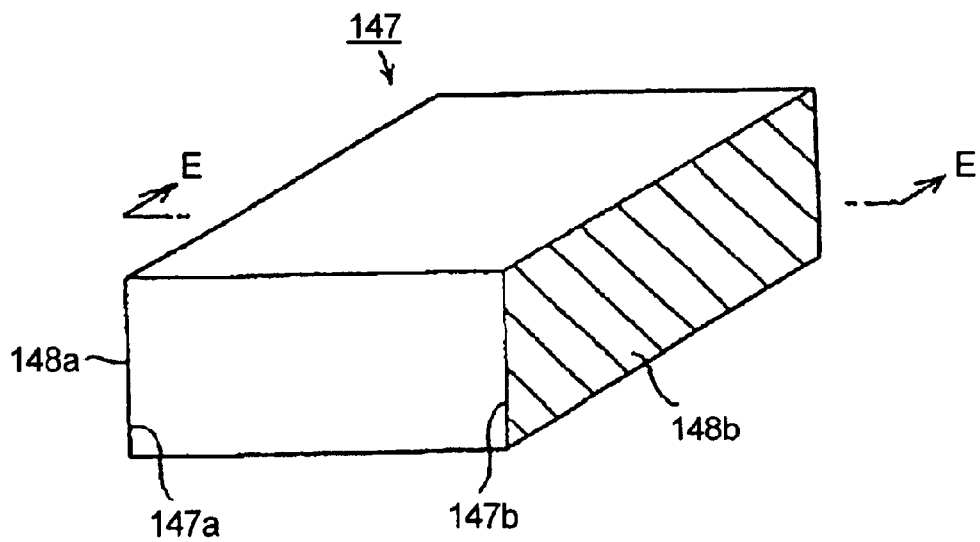
FIG. 22A is a perspective view showing a mother sintered ceramic compact body obtained in the fourth preferred embodiment.

As shown in FIG. 22A, polarization electrodes 148a and 148b are formed on the opposite first and second sides 147a and 147b, respectively, of the mother sintered compact 147 so that a DC voltage is applied between the polarization electrodes 147a and 147b. As a result, the ceramic layers in the sintered ceramic compact body 147 are polarized as shown by arrows P1 and P2 in FIG. 22B.

Figure 22B:
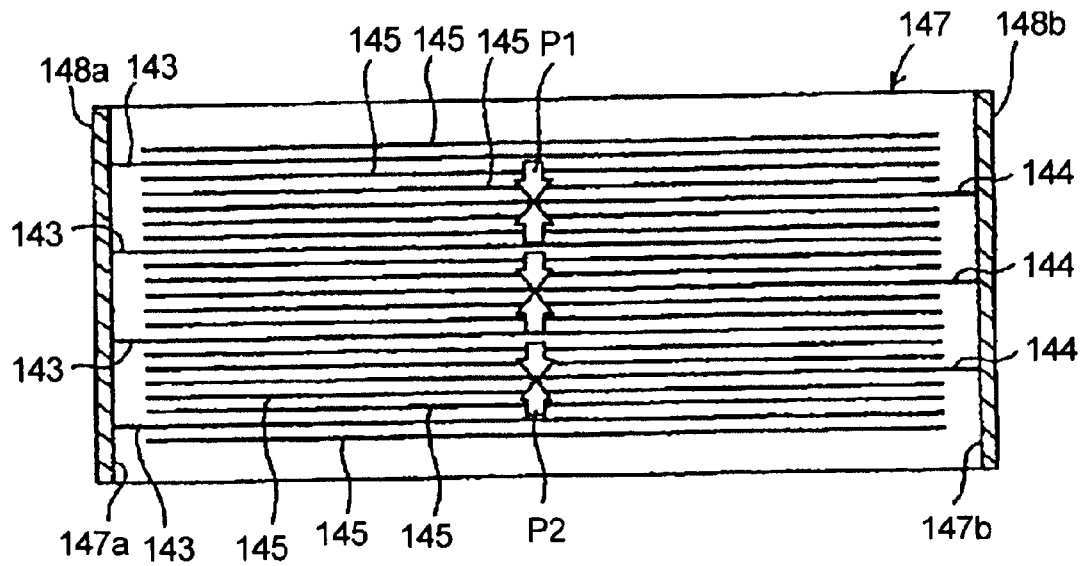
FIG. 22B is a sectional view taken along line E—E in FIG. 22A.

In this case, a DC electric field is applied to the ceramic layers held between the internal electrode-dummy electrode patterns 143 and 144 in the thickness direction to polarize the ceramic layers between the internal electrode-dummy electrode patterns 143 and 144 in the thickness direction, as shown by arrows P1 and P2 in FIG. 22B. Since the internal electrode-dummy electrode patterns 143 and 144 are led to the sides 147a and 147b alternately in the thickness direction, the ceramic layers on both sides of each of the internal electrode-dummy electrode patterns 143 and 144 are polarized in opposite directions.

Like in the third embodiment, the floating electrodes 145 are arranged in parallel with the internal electrode-dummy electrode patterns 143 and 144, and thus produce no influence on polarization.

Figure 23:
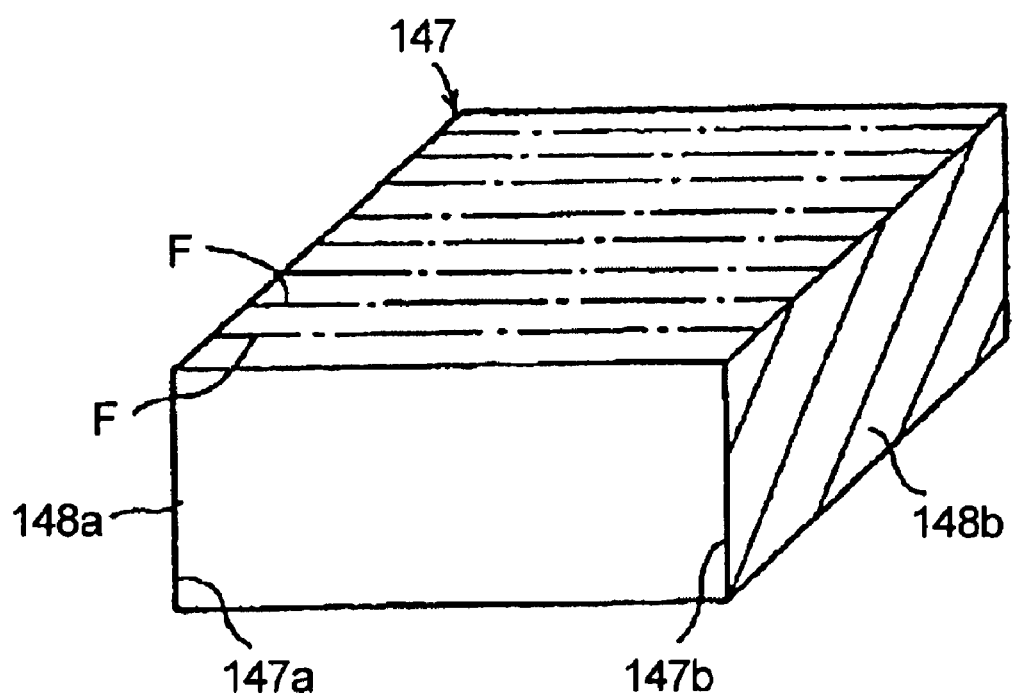
FIG. 23 is a perspective view showing a mother sintered ceramic compact body obtained in the fourth preferred embodiment.
Figure 24A:
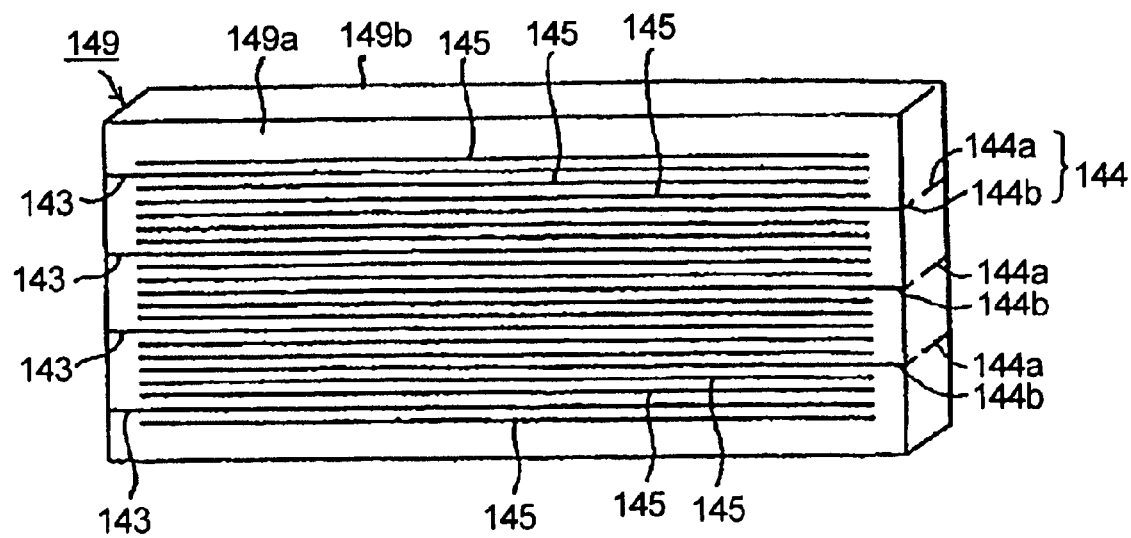
FIG. 24A is a perspective view showing a sintered compact block obtained by cutting a mother sintered compact.

Next, the mother sintered ceramic compact body 147 is cut by using a dicer perpendicularly to the internal electrode-dummy electrode patterns 143 and 144 along one-dot chain lines F in FIG. 23. By cutting, the plate-shaped sintered block 149 shown in FIG. 24A is obtained. As be seen from FIG. 24B which is a cross-sectional view of the sintered block 149, the floating electrode patterns 145 are not led to the first and second sides 149a and 149b of the sintered block 149.

Figure 24B:
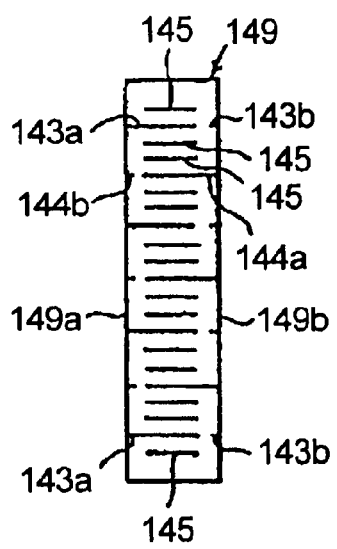
FIG. 24B is a cross-sectional view of FIG. 24A.

On the other hand, the internal electrode-dummy electrode patterns 143 and 144 are divided into internal electrodes and dummy electrodes by cutting the stripes for obtaining the sintered block 149. Namely, as shown in FIG. 24B, one of the stripes of the internal electrode-dummy electrode pattern 143 is cut to form an internal electrode 143a, and a portion of the adjacent stripe at the same height is thinly cut to form a dummy electrode 143b. Similarly, the other internal electrode-dummy electrode pattern 144 is also divided into internal electrodes 144a and dummy electrodes 144b.

Figure 25:
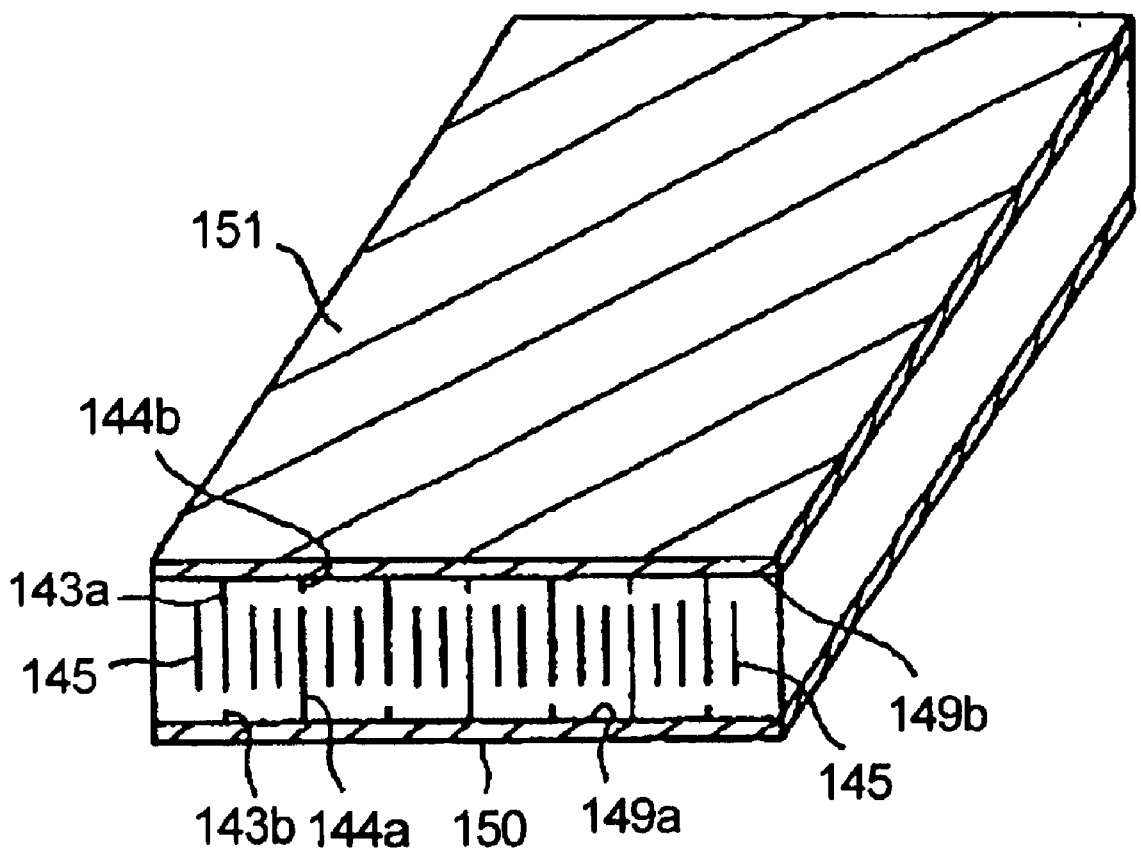
FIG. 25 is a perspective view showing a state in which mother external electrodes are formed on both sides of a sintered compact block.

Next, mother external electrodes 150 and 151 are formed on the first and second sides 149a and 149b, respectively, of the sintered block 149, as shown in FIG. 25. Although the external electrodes 150 and 151 can be formed by sputtering Monel and Ag in turn to a thickness of about 1 m, the external electrodes 150 and 151 may be formed by another thin film deposition method such as plating, vaporization, or the like.

Figure 18:
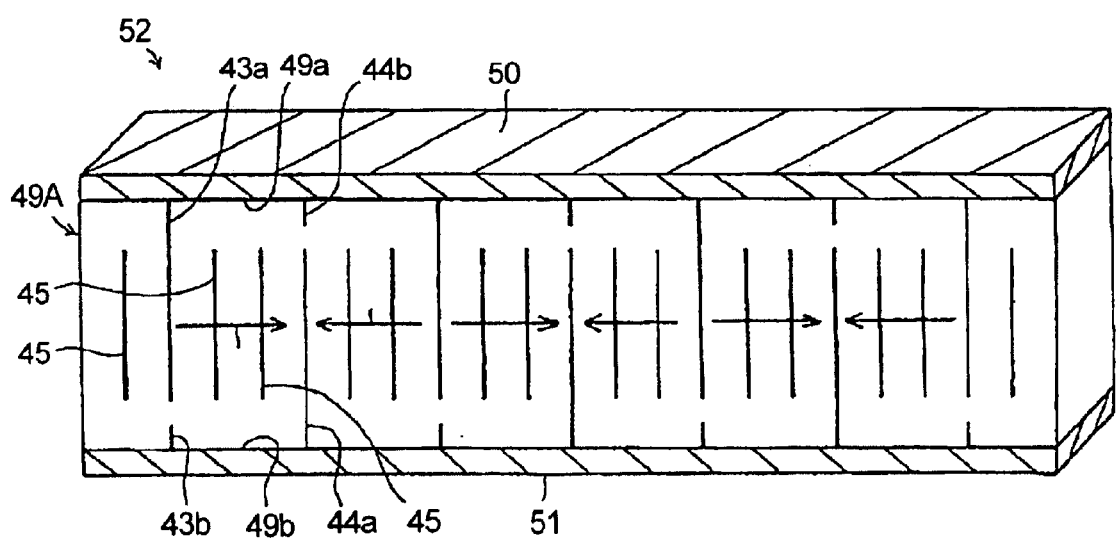
FIG. 18 is a perspective view showing a multilayer piezoelectric resonator in accordance with a fourth preferred embodiment of the present invention.

Then, the sintered block 149 shown in FIG. 25 is cut perpendicularly to the internal electrodes 143a and 144a to obtain a multilayer piezoelectric resonator 152 in accordance with the second embodiment shown in FIG. 18.

As shown in FIG. 18, the multilayer piezoelectric resonator 152 comprises a sintered ceramic compact body 149A obtained by cutting the sintered block 149. The internal electrodes, dummy electrodes and floating electrodes are denoted by the same reference numerals as those of the sintered block 149. As be seen from FIG. 18, the first and second external electrodes 150 and 151 are formed on the first and second sides 149a and 149b, respectively, of the sintered ceramic compact body 149A. The internal electrodes 143a are electrically connected to the first external electrode 150 but not electrically connected to the other external electrode 151. The internal electrodes 144a are electrically connected to the second external electrode 151 but not electrically connected to the first external electrode 150. The floating electrodes 145 are formed not to contact the sides 149a and 149b of the sintered ceramic compact body 149A, and thus they are not electrically connected to the external electrodes 150 and 151.

In the piezoelectric resonator 152 of this embodiment, an AC voltage is applied between the external electrodes 150 and 151 to expand and contract the ceramic layers between the internal electrodes 143a and 144a in the thickness direction due to the piezoelectric effect. Since the sintered ceramic compact body 149A has a rod-like shape which is long in the stacking direction of the internal electrodes 143a and 144a, a fundamental wave in a longitudinal vibration mode is excited by the above expansion and contraction of the ceramic layers to obtain intended resonance characteristics based on the fundamental wave.

In the piezoelectric resonator 152, the floating electrodes 145 are arranged between the internal electrodes 143a and 144a, and in the ceramic layers outside the outermost internal electrodes 143a and 144a in the stacking direction, thereby suppressing the diffusion of a constituent metal of the internal electrodes 143a and 144a in firing. Therefore, the residual ratio of the internal electrodes 143a and 144a after firing is increased to increase the frequency difference ΔF between the resonance frequency and antiresonance frequency.

Since the diffusion of the internal electrode constituent metal can be suppressed, variations in resonance characteristics can be effectively decreased.

In addition, in the fourth embodiment, the dummy electrodes 143b and 144b are respectively provided on the distal sides of the internal electrodes 143a and 144a in the planes where the internal electrodes 143a and 144a are respectively provided, suppressing the horizontal diffusion of the constituent metal of the internal electrodes 143a and 144a. Therefore, it is possible to further increase the residual ratio of the internal electrodes 143a and 144a, widen the frequency difference ΔF and decrease variations in resonance characteristics, as compared with the first embodiment.

Although, in the above-described embodiments, the plurality of floating electrodes are arranged between the internal electrodes, one floating electrode may be provided between the internal electrodes, or floating electrodes may be arranged only in the ceramic layers between the internal electrodes. Alternatively, the floating electrode may be arranged only in the ceramic layers outside the outermost internal electrodes in the stacking direction of the internal electrodes.

The floating electrode may be arranged only in at least one of the ceramic layers held between the internal electrodes. Namely, in the present invention, the floating electrode is arranged in at least one of the ceramic layers held between the internal electrodes and the ceramic layers outside the outermost internal electrodes in the stacking direction thereof, thereby suppressing the diffusion of the internal electrode constituent metal from the internal electrodes near the floating electrodes in a degree lower than the above-described embodiments. In this case, the effect of the present invention can be obtained.

Also, the dummy electrodes are not necessarily arranged for all internal electrodes.

Furthermore, the multilayer piezoelectric resonator of the third embodiment comprises the floating electrodes, and the multilayer piezoelectric resonator of the fourth embodiment comprises both the floating electrodes and dummy electrodes. However, since the floating electrodes and dummy electrodes are provided for suppressing the diffusion of the internal electrode constituent metal into ceramic during firing, only the dummy electrodes may be used without the use of the floating electrodes. In other words, by arranging only the dummy electrodes, which are provided in the fourth embodiment, in a multilayer piezoelectric resonator, it is possible to suppress the diffusion of the internal electrode constituent metal in the planar direction where the internal electrodes are formed, and thus widen the frequency difference ΔF and decrease variations in resonance characteristics.

As described above, in the multilayer piezoelectric resonator of the present invention, at least one floating electrode is arranged in at least one ceramic layer of the ceramic layers between the adjacent internal electrodes in the stacking direction and/or the ceramic layers outside the outermost internal electrodes in the stacking direction, thereby suppressing the diffusion of the internal electrode constituent metal from the internal electrodes adjacent to the floating electrodes during firing. Therefore, the internal electrodes having dimensions close to design values are formed, widening the frequency difference ΔF between the resonance frequency and antiresonance frequency, as compared with a conventional multilayer piezoelectric resonator. For example, in formation of a band pass filter, the band can be widened. By suppressing the diffusion of the internal electrode constituent metal, variations in resonance characteristics are also significantly decreased.

It is thus possible to provide a multilayer piezoelectric resonator exhibiting good resonance characteristics and small variations in the resonance characteristics.

In the multilayer piezoelectric resonator, where the internal electrodes and floating electrodes are formed to contact the first and second sides of the sintered ceramic compact body, and the insulating films are formed so that the internal electrodes are connected to only one of the first and second external electrodes, and the floating electrodes are not connected to the external electrodes, the effective area of the internal electrodes can be increased. In addition, the floating electrodes are formed between the first and second sides of the sintered ceramic compact body, thereby further increasing the effective area of the internal electrodes, and suppressing the diffusion of the internal electrode constituent metal in the thickness direction. It is thus possible to further widen the frequency difference ΔF and decrease variations in resonance characteristics.

Furthermore, in the multilayer piezoelectric resonator, where the dummy electrodes are respectively formed in the same planes as the internal electrodes, the diffusion of the internal electrode constituent metal along the planar direction of the internal electrodes is also suppressed, thereby further widening the frequency difference ΔF and further decreasing variations in resonance characteristics.

In the multilayer piezoelectric resonator, where a plurality of the floating electrodes are arranged in the ceramic layers between the adjacent internal electrodes and/or the ceramic layers outside the outermost internal electrodes in the stacking direction, the presence of the floating electrodes can effectively suppress the diffusion of the internal electrode constituent metal, thereby further widening the frequency difference ΔF and further decreasing variations in resonance characteristics.

Furthermore, in the multilayer piezoelectric resonator, where the dummy electrodes respectively are in the same planes as the internal electrodes, the diffusion of the internal electrode constituent metal to the ceramic side in the planar direction of the internal electrodes, thereby widening the frequency difference ΔF and further decreasing variations in resonance characteristics. Therefore, like in the above-described multilayer piezoelectric resonator, it is possible to widen the pass band, and obtain a multilayer piezoelectric resonator causing less variation in resonance characteristics, as compared with a conventional multilayer piezoelectric resonator.

The method of manufacturing a multilayer piezoelectric resonator of the present invention can obtain the above-described multilayer piezoelectric resonators, and can thus widen the frequency difference ΔF and decrease variations in resonance characteristics.

The method of manufacturing a multilayer piezoelectric resonator of the present invention can also obtain a multilayer piezoelectric resonator in which dummy electrodes are respectively formed in the same planes as internal electrodes. Therefore, like in the above-mentioned cases, the presence of the dummy electrodes can effectively suppress the diffusion of the internal electrode constituent metal to the ceramic side in the planar direction of the internal electrodes during firing. Namely, like in the above-described cases, it is possible to widen the frequency difference ΔF and decrease variations in resonance characteristics.

A method of manufacturing a piezoelectric transformer in accordance with a fifth embodiment of the present invention, and the structure of the piezoelectric transformer are described below with reference to FIGS. 26A to 30.

First, a sheet is formed by the doctor blade method using ceramic slurry composed of a lead titanate zirconate piezoelectric ceramic powder as a main component to obtain a green sheet having a thickness of about 20 to 100 μm. The thus-obtained green sheet is cut in a rectangular shape.

Then, an internal electrode and dummy electrode are printed on the upper side of the green sheet. The printing comprises screen-printing Ag—Pd paste to a thickness of several μm, and then drying. The conductive paste used for forming the internal electrode and dummy electrode is not limited to Ag—Pd paste, and various types of paste containing various metals or alloy powders, such as Ag paste and the like, can also be used.

A plurality of the thus-obtained green sheets are stacked to obtain a layered product. The stacking method will be described with reference to FIG. 27.

Figure 27:
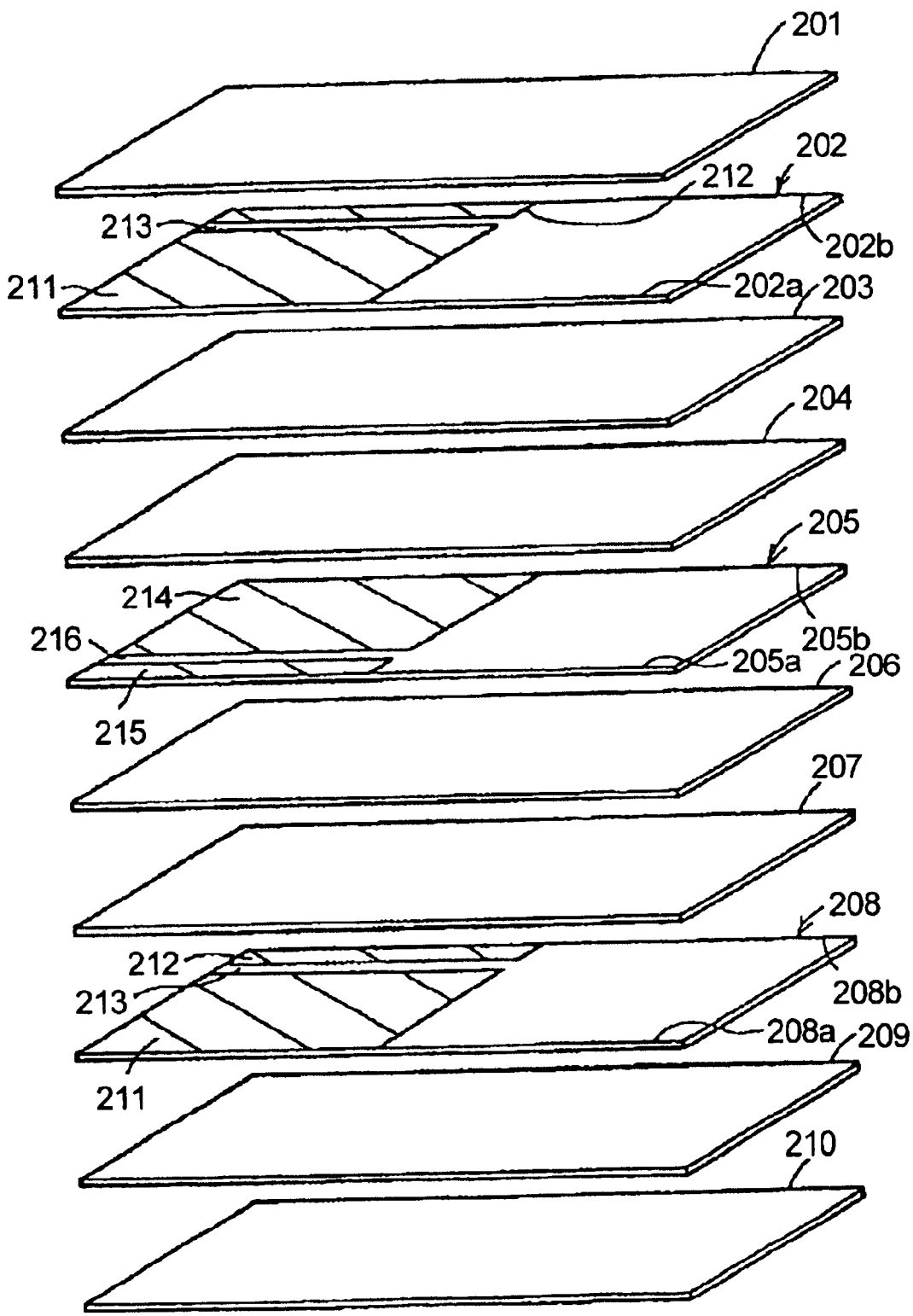
FIG. 27 is an exploded perspective view illustrating green sheets and electrode shapes formed thereon which are used for manufacturing the piezoelectric transformer of the fifth preferred embodiment of the present invention.

FIG. 27 shows green sheets 201 to 210 which constitutes an upper stacked portion. The green sheet 201 is an unpatterned green sheet on which the internal electrode and dummy electrode are not printed, and which constitutes the uppermost layer of the layered product.

A first internal electrode 211 and a first dummy electrode 212 are printed on each of the green sheets 202 and 208. The first internal electrodes 211 are respectively formed along long-side edges 202a and 208a of the green sheets 202 and 208. The first dummy electrodes 212 are respectively formed along the other long-side edges 202b and 208b of the green sheets 202 and 208. The internal electrodes 211 and the dummy electrodes 212 are opposed to each other with a gap therebetween.

A second internal electrode 214 and a second dummy electrode 215 are printed on the green sheet 205. The second internal electrode 214 and the second dummy electrode 215 are formed on the opposite sides to the first internal electrodes 211 and the first dummy electrodes 212 formed on the green sheets 202 and 208. Namely, the second dummy electrode 215 is formed along the edge 205a of the green sheet 205 which is overlapped with the edges 202a and 208a of the green sheets 202 and 208 in stacking; the second internal electrode 214 is formed along the other edge 205b of the green sheet 205.

The second internal electrode 214 and the second dummy electrode 215 are opposed with a gap 216 therebetween.

The green sheets 203, 204, 206, 207, 209 and 210 are unpatterned green sheets. In other words, two unpatterned green sheets are arranged between the green sheet on which the first internal electrode 211 and the first dummy electrode 212 are printed, and the green sheet on which the second internal electrode 214 and the second dummy electrode 215 are printed.

A plurality of the green sheets are stacked in the order shown in FIG. 27, and unpatterned green sheets are stacked in the lowermost layer, followed by compression in the thickness direction to obtain a layered product.

Figure 28A:
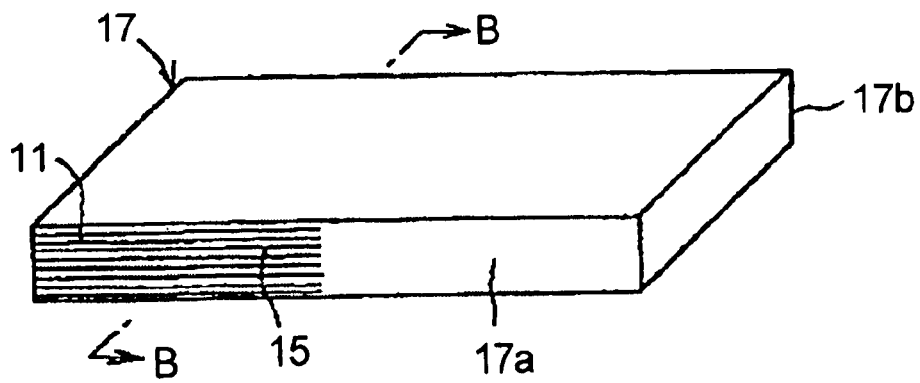
FIG. 28A is a perspective view showing a layered product prepared for obtaining the fifth preferred embodiment of the present invention.
Figure 28B:
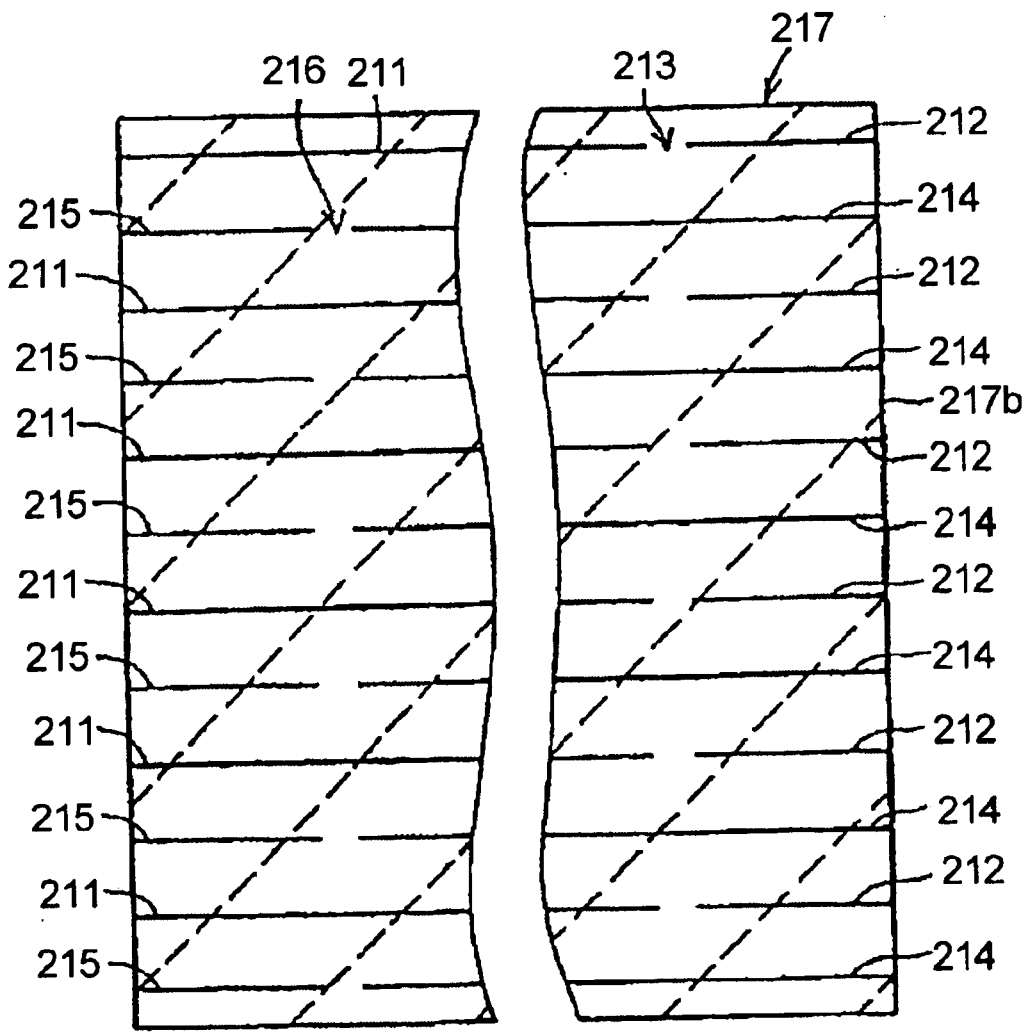
FIG. 28B is a sectional view taken along line B—B in FIG. 28A.

FIGS. 28A and 28B show the thus-obtained layered product.

As seen from FIG. 28B, the first internal electrodes 211 are led to the first side 217a of the layered product 217. The second internal electrodes 214 are led to the second side 217b.

At the heights where the first internal electrodes 211 are respectively formed, the first dummy electrodes 212 are respectively formed and led to the second side 217b. Similarly, at the heights where the second internal electrodes 214 are respectively formed, the second dummy electrodes 215 are respectively formed and led to the first side 217a.

Next, the layered product 217 is burned at a temperature of about 1000 to 1200° C. for several hours to obtain a sintered ceramic compact body.

Figure 29A:
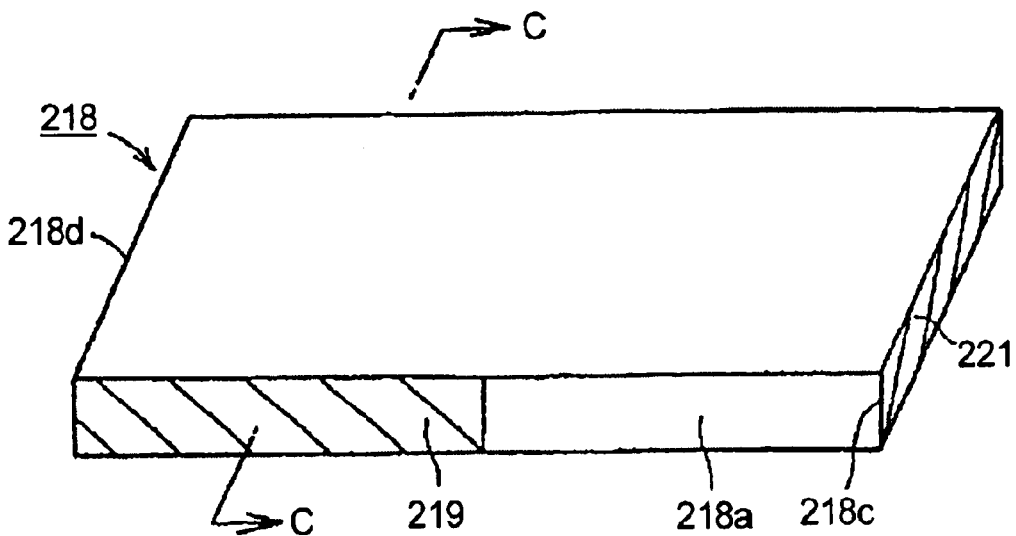
FIG. 29A is a perspective view illustrating a sintered ceramic compact body and external electrodes prepared in the fifth preferred embodiment of the present invention.

The sintered ceramic compact body 218 shown in FIG. 29 is obtained by the above-described method.

In the sintered ceramic compact body 218, first and second external electrodes 219 and 220 are formed on portions of first and second sides 218a and 218b, which are close to a fourth side 218d along the short sides. The first external electrode 219 is formed from the center of the first side 218a in the length direction to the fourth side 218d, as shown in FIG. 29. Similarly, the second external electrode 220 is also formed from the center of the second side 218b to the fourth side 218d.

The first and second external electrodes 219 and 220 are formed by baking Ag paste. Of course, these external electrodes may be formed by another method such as evaporation, plating, or the like.

Figure 29B:
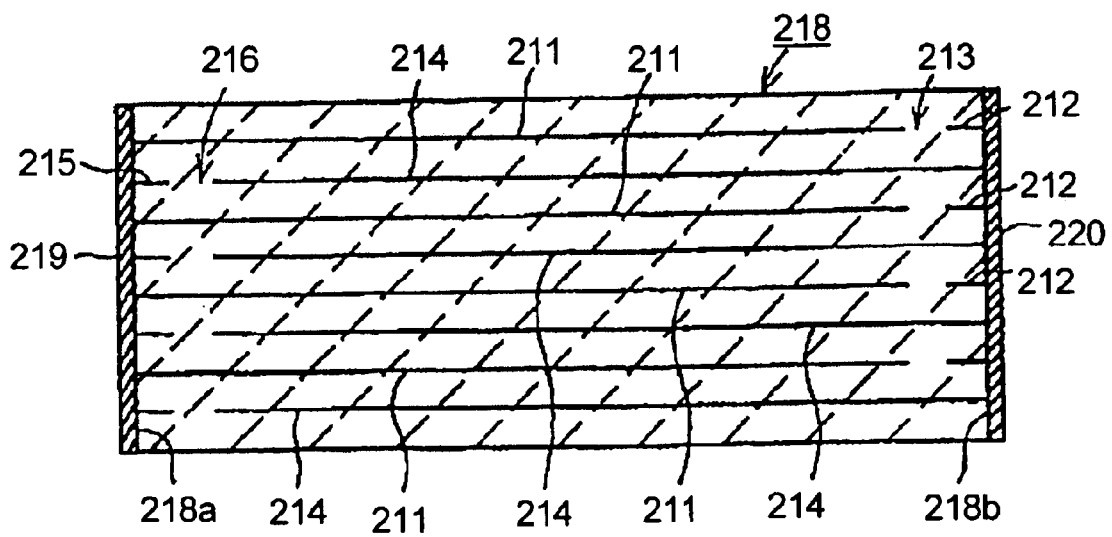
FIG. 29B is a sectional view taken along line C—C in FIG. 29A.

As be seen from FIG. 29B, the first external electrode 219 is electrically connected to the first internal electrodes 211 and the second dummy electrodes 215. The second external electrode 220 is electrically connected to the second internal electrodes 214 and the first dummy electrodes 212.

Next, Ag paste is coated on the third side 218c along the short side of the sintered ceramic compact body 218, and then baked to form a third external electrode 221. Then, a DC voltage is applied between the first and second external electrodes 219 and 220 to polarize the portions in the sintered ceramic compact body 218, where the internal electrodes 211 and 214 are overlapped with each other. In this way, the ceramic layers in the portions where the internal electrodes 211 and 214 are overlapped with each other are polarized in directions shown by arrows P1 and P2 in FIG. 26B. Namely, in the portions where the internal electrodes 211 and 214 are overlapped with other, the ceramic layers are polarized in the thickness direction. The ceramic layers on both sides of each of the internal electrodes 211 or 214 are polarized in opposite directions in the thickness direction.

Figure 26A:
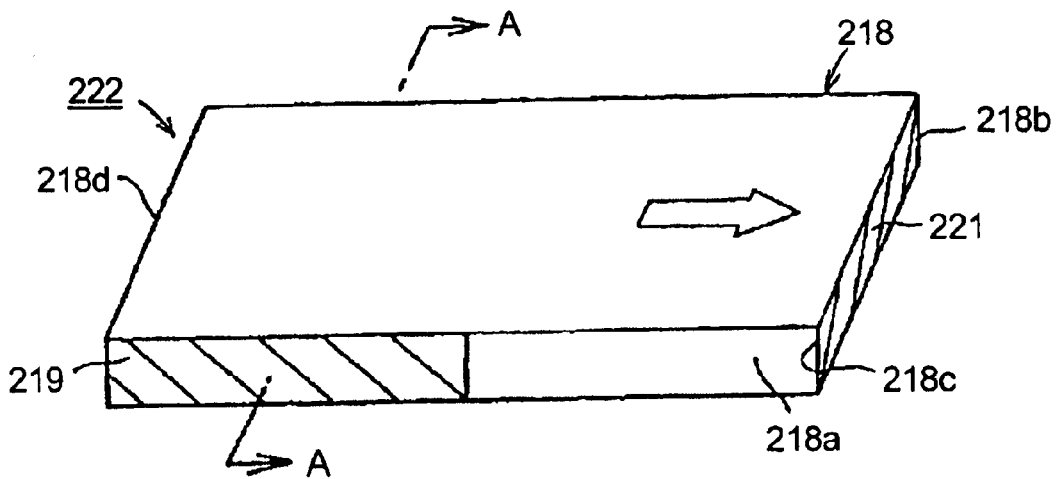
FIG. 26A is a perspective view showing a piezoelectric transformer in accordance with a fifth preferred embodiment of the present invention.

Then, the first and second external electrodes 219 and 220 are short circuited, and a DC voltage is applied between the first and second external electrodes 219 and 220 and the third external electrode 221 serving as an output-side electrode to polarize the portion of the sintered ceramic compact body 218 ranging from the center in the length direction to the third side 218c, as shown by arrow P in FIG. 26A. Namely, the right-hand half of the sintered ceramic compact body 218 shown in FIG. 26A is polarized along the length direction of the sintered ceramic compact body 218.

Figure 26B:
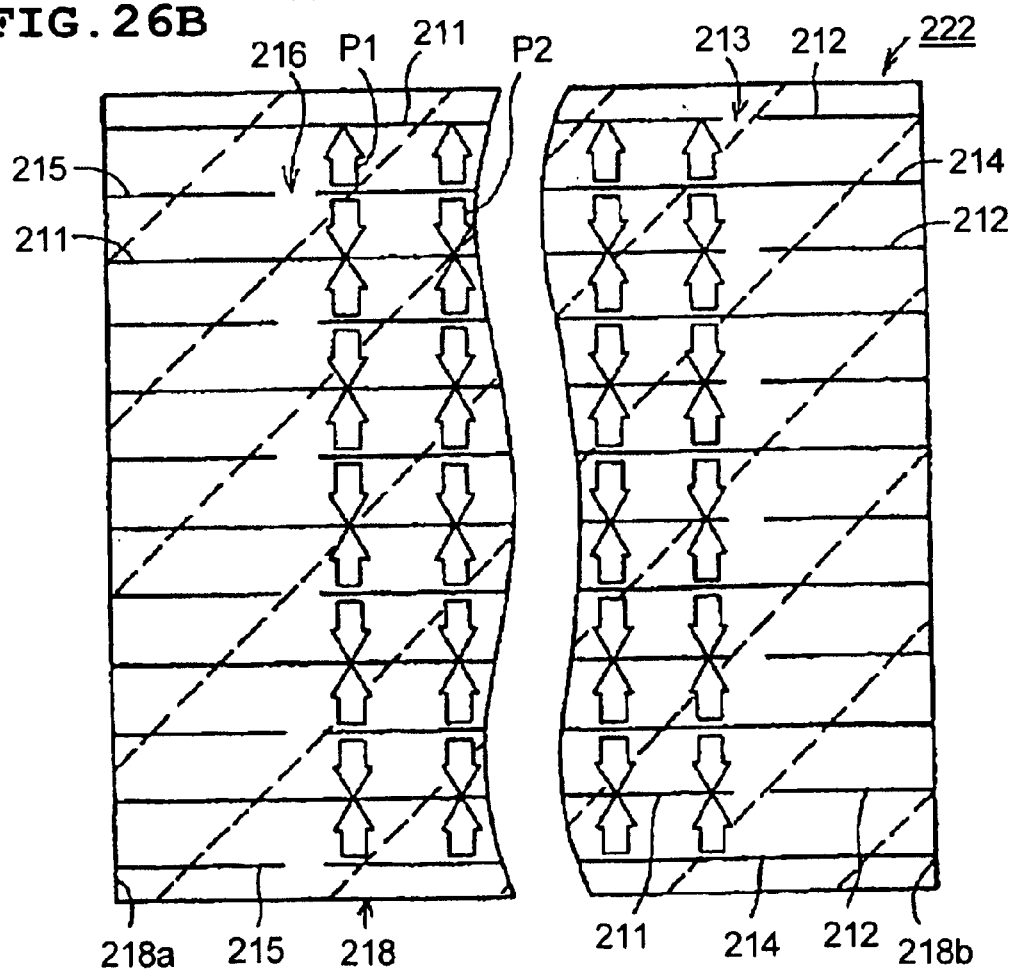
FIG. 26B is a sectional view taken along line A—A in FIG. 26A.

In this way, the piezoelectric transformer 222 of this embodiment shown in FIGS. 26A and 26B is obtained.

In the piezoelectric transformer 222, an input voltage is applied between the first and second external electrodes 219 and 220 to excite the ceramic layers stacked between the internal electrodes 211 and 214 in the length vibration mode, and excite the sintered ceramic compact body 218 as a whole in the length vibration mode, thereby obtaining a stepped-up output voltage from the third external electrode 221 serving as an output electrode.

The piezoelectric transformer 222 of this embodiment is characterized in that besides the internal electrodes 211 and 214, the dummy electrodes 212 and 215 are respectively formed at the same heights as the internal electrodes 211 and 214 to increase the maximum efficiency of the piezoelectric transformer 222, and decrease variations in the maximum efficiency. In other words, in the firing step for obtaining the sintered ceramic compact body 218, the internal electrode constituent metal such as Ag tends to diffuse into ceramic from the internal electrodes 211 and 214. In a sintered ceramic compact body used in a conventional piezoelectric transformer, the finally obtained internal electrodes are partially cut due to the diffusion, and thus the internal electrodes cannot be obtained according to design values.

On the other hand, in this embodiment, the dummy electrodes 212 and 215 are respectively formed opposite to the internal electrodes 211 and 214 at the same heights as the internal electrodes 211 and 214 with the gaps 213 and 216, and thus the internal electrode constituent metal tends to diffuse into ceramic from the dummy electrodes 212 and 215. Therefore, the same metal tends to diffuse into ceramic from the internal electrodes 211 and 214 and the dummy electrodes 212 and 215, lowering the concentration gradient of the metal between the internal electrodes 211 and 214 and the ceramic. This suppresses the diffusion of the internal electrode constituent metal from the internal electrodes 211 and 214.

Therefore, in the sintered compact 218, the internal electrodes 211 and 214 substantially maintain a shape according to design values. It is thus possible to increase the maximum efficiency, and decrease variations in maximum efficiency due to less variation in the shapes of the internal electrodes 211 and 214. This will be described below with reference to experimental examples.

The first and second internal electrodes 211 and 214, and the dummy electrodes 212 and 215 are formed in the sintered ceramic compact body composed of lead titanate zirconate piezoelectric ceramic according to the following procedure to form various piezoelectric transformers.

Namely, a sintered ceramic compact body of 20 mm long×6 mm wide×1.2 mm thick was prepared as the sintered ceramic compact body 218. The thickness of each of the ceramic layers held between the internal electrodes was 100 µm.

Figure 30:
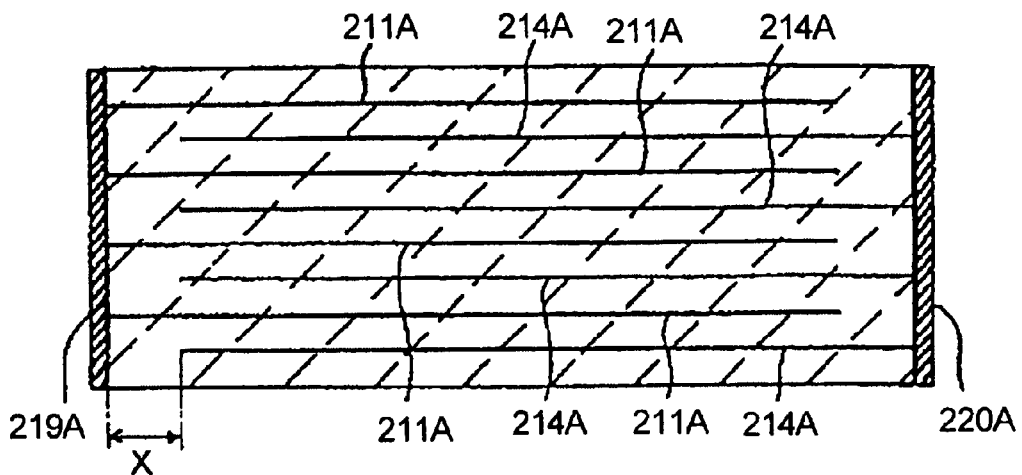
FIG. 30 a cross-sectional view illustrating the structure of a piezoelectric transformer prepared as a comparative example in an experimental example.

For comparison, a piezoelectric transformer having the same configuration as the embodiment except that the dummy electrodes are not provided, as shown in FIG. 30, was formed. In this case, the distance between an end of each of first and second internal electrodes 211A and 214A and the opposite external electrode 220A or 219A was 500 µm. Furthermore, dummy electrodes having various sizes were formed in a region having a width of 500 µm of a sintered ceramic compact body comprising the internal electrodes 211A and 214A formed therein to form various piezoelectric transformers according to the present invention. In other words, the gaps 213 and 216 (the distance between the ends of the internal electrodes 211 and 214 on the side not connected to the external electrode 219 or 220, and the dummy electrodes 212 and 215) shown in FIG. 29B were changed to 50, 100, 200, 300 and 400 µm to form piezoelectric transformers.

For each of the thus-obtained various piezoelectric transformers, the frequency of the input voltage was changed to determine the maximum efficiency (=(output power/input power)×100%). The results are shown in FIG. 31.

Figure 31:
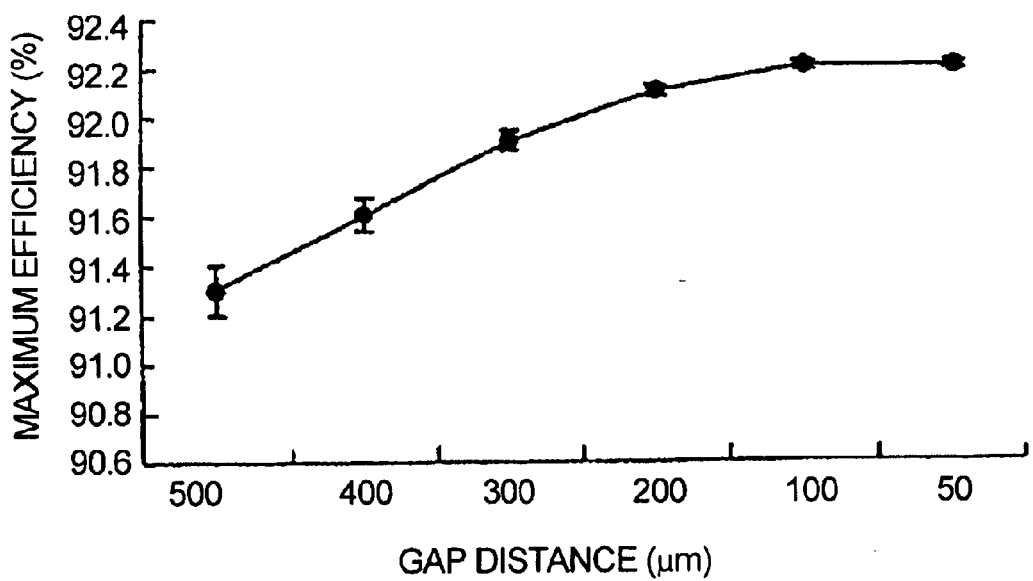
FIG. 31 is a graph showing the relation between the gap distance between an end of an internal electrode and a dummy electrode, and the maximum efficiency of a piezoelectric transformer and variations thereof.

In FIG. 31, the average maximum efficiency of 70 piezoelectric transformers is marked by $\mu$, and a range shown by a line segment at each mark $\mu$ indicates variation $\mu$.

In FIG. 31, a gap distance of 500 µm represents the structure shown in FIG. 30, i.e., a structure in which no dummy electrode is formed because of a gap distance of 500 µm.

FIG. 31 indicates that in each of the piezoelectric transformers comprising the dummy electrodes 212 and 215, the maximum efficiency is increased, and variation thereof is decreased, as compared with the piezoelectric transformer as a comparative example in which the dummy electrodes 212 and 215 are not formed. Particularly, it is found that as the gap distance decreases, the maximum efficiency increases, and the variation decreases. This is possibly due to the fact that the diffusion of the internal electrode constituent metal from the internal electrodes 211 and 214 is securely suppressed by decreasing the gap distance.

In addition, the presence of the dummy electrodes 212 and 215 prevents breakage of the internal electrodes 211 and 214 to increase the volume polarized in polarizing the ceramic layers in the thickness direction. This also possibly suppresses the variation of maximum efficiency.

It is thus found that in order to increase the maximum efficiency and decrease the variation thereof, the gap distance between the internal electrodes 211 and 214 and the dummy electrodes 212 and 215 is preferably decreased.

However, where the gap distance is smaller than the distance between the adjacent internal electrodes in the thickness direction, dielectric breakdown readily occurs in polarization of the ceramic layers held between the internal electrodes 211 and 214. Therefore, the gap distance is preferably larger than the distance between the adjacent internal electrodes in the thickness direction. In the piezoelectric transformer of this embodiment, therefore, the gap distance is preferably 100 m to 300 m in order to increase the maximum efficiency, decrease the variation of the maximum efficiency, and securely avoid dielectric breakdown.

Figure 32:
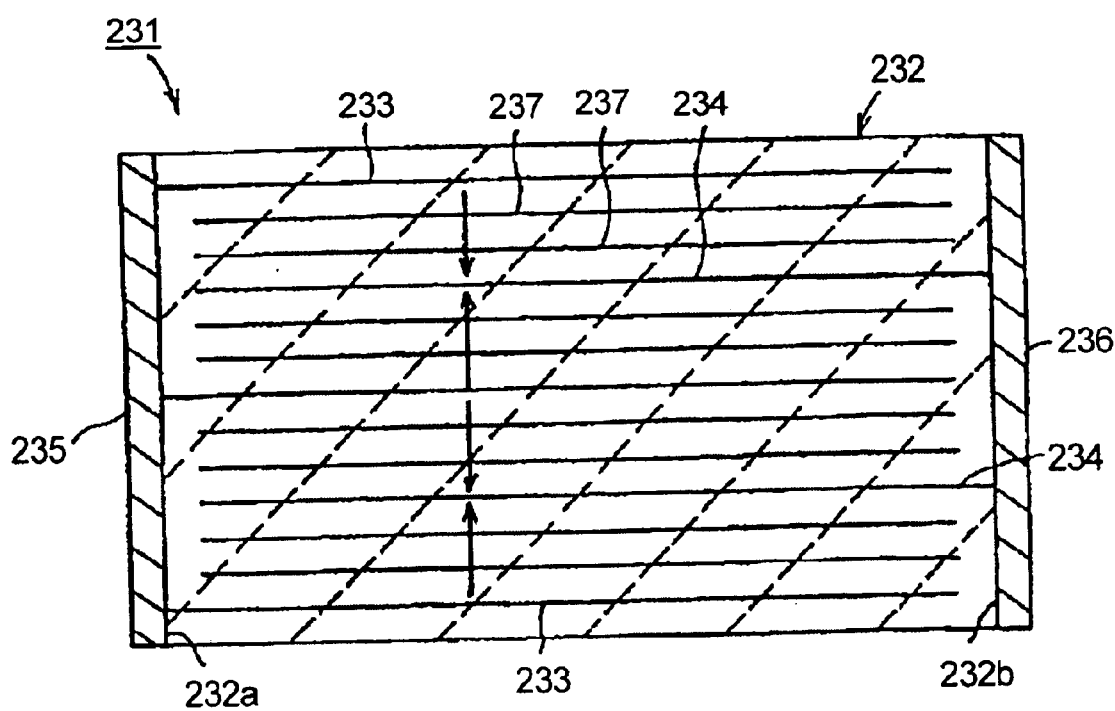
FIG. 32 is a longitudinal sectional view illustrating a piezoelectric transformer in accordance with a sixth preferred embodiment of the present invention.
Figure 33:
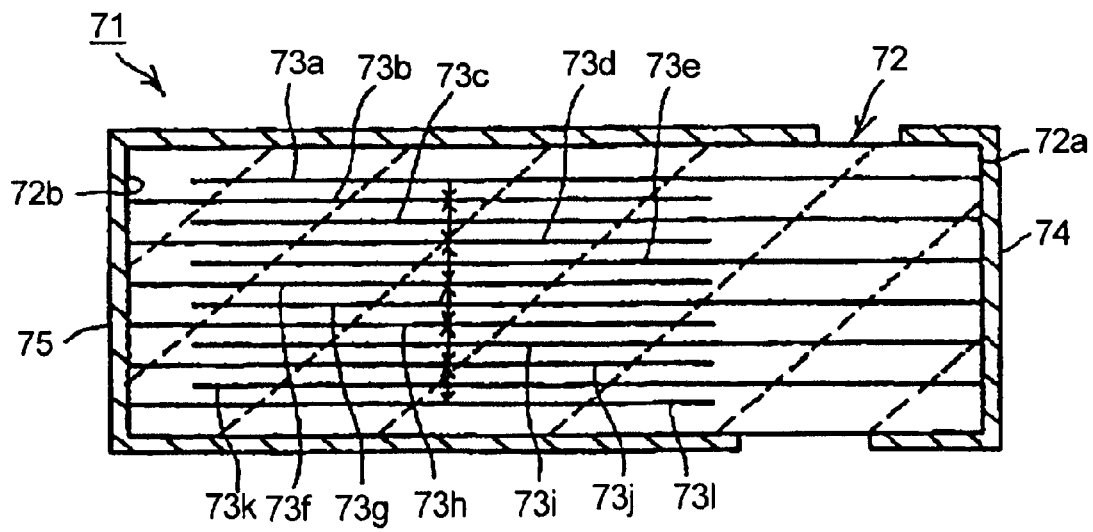
FIG. 33 is a sectional view illustrating a conventional piezoelectric actuator.
Figure 34:
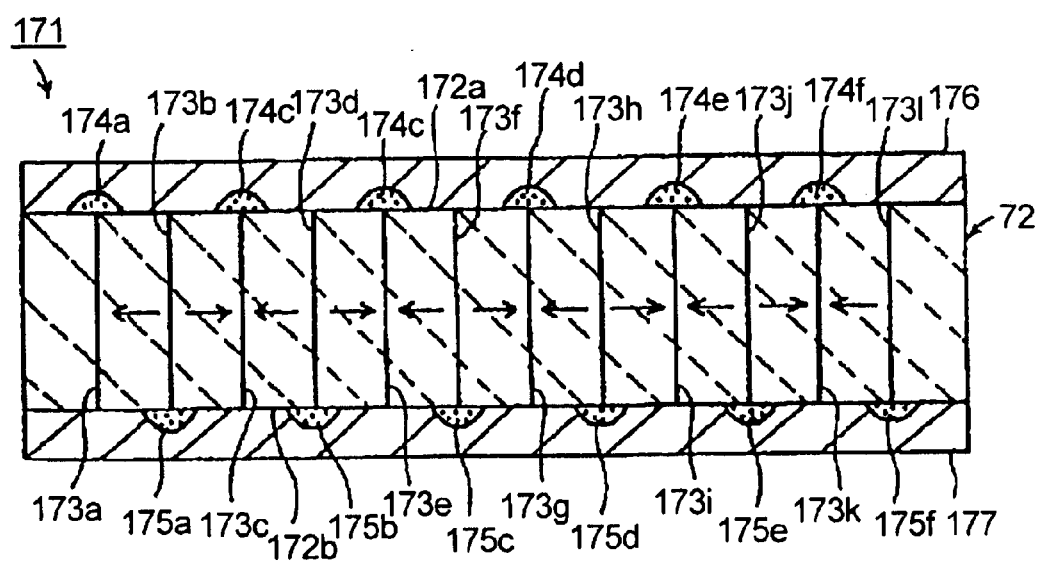
FIG. 34 is a longitudinal sectional view illustrating a conventional multilayer piezoelectric resonator.
Figure 35:
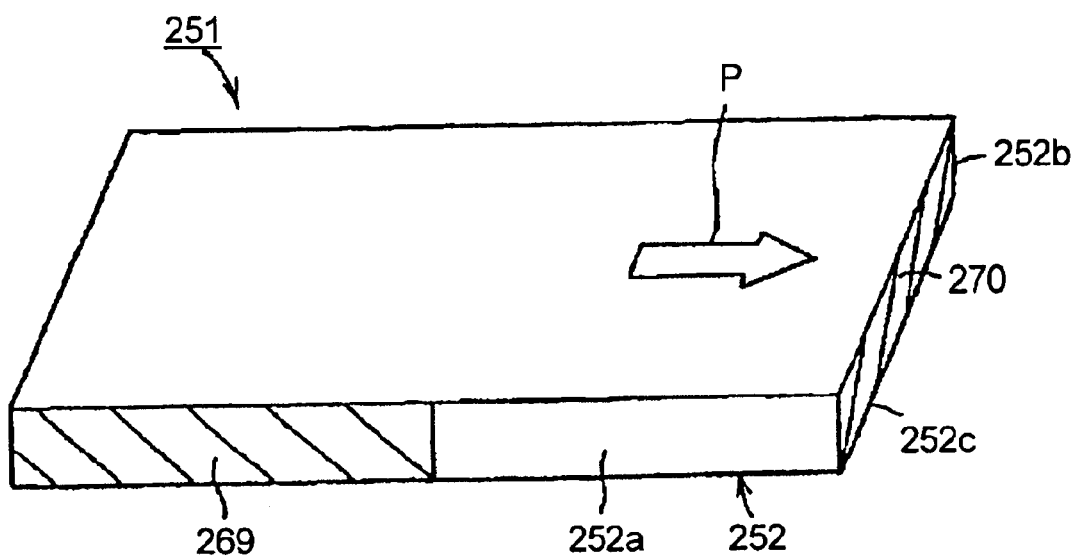
FIG. 35 is a perspective view illustrating an example of conventional piezoelectric transformers.
Figure 36:
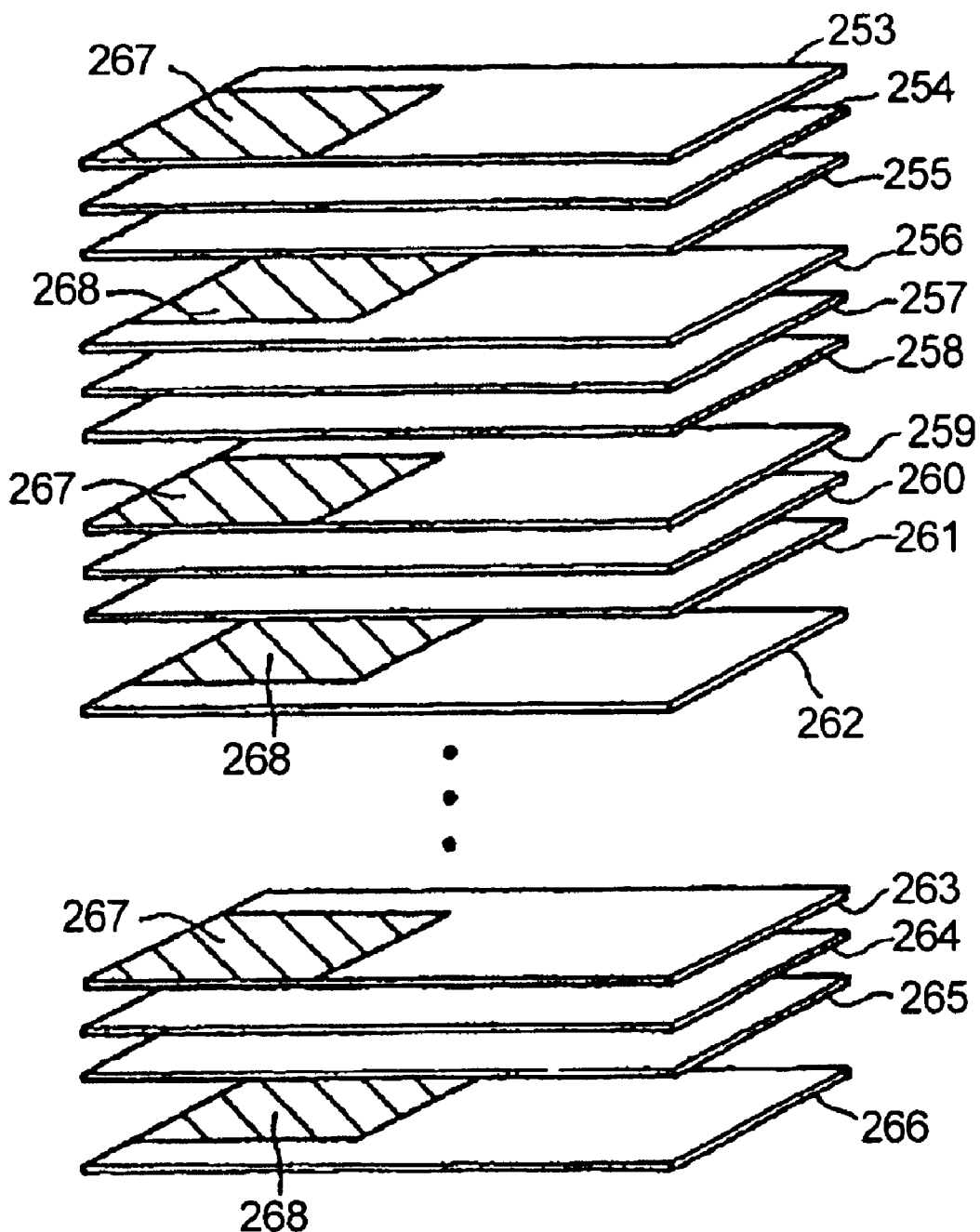
FIG. 36 is an exploded perspective view illustrating green sheets and electrode patterns formed thereon which are used for manufacturing a conventional piezoelectric transformer.

FIG. 32 is a cross-sectional view showing a piezoelectric transformer in accordance with a sixth embodiment of the present invention.

In the piezoelectric transformer of the embodiment shown in FIG. 26, the dummy electrodes 212 and 215 are respectively formed at the same heights as the internal electrodes 211 and 214 in the sintered ceramic compact body 218. However, in the present invention, floating electrodes may be provided between internal electrodes in place of dummy electrodes in order to decrease variations in the maximum efficiency.

The piezoelectric transformer 231 shown in FIG. 32 comprises a sintered ceramic compact body 232 composed of piezoelectric ceramic such as lead titanate zirconate or the like. In the sintered ceramic compact body 232, a plurality of first and second internal electrodes 233 and 234 are stacked so as to overlap with each other in the thickness direction. The first internal electrodes 233 are led to the first side 232a of the sintered ceramic compact body 232; the second internal electrodes 234 are led to the second side 232b opposite to the first side 232a.

A first external electrode 235 is formed to cover the first side 232a; a second external electrode 236 is formed to cover the second side 232b. In addition, floating electrodes 237 are arranged between the internal electrodes 233 and 234 so as not to be electrically connected to the external electrodes 235 and 236.

The ceramic layers between the internal electrodes 233 and 234 are polarized in the thickness direction, as shown by arrows in FIG. 32. Namely, like in the first embodiment, the ceramic layers on both sides of each of the internal electrodes are polarized in opposite directions in the thickness direction.

Like in the fifth embodiment, the first and second internal electrodes 233 and 234 are stacked in a region from the center of the rectangular plate-shaped sintered ceramic compact body 232 to one short side thereof. The other portion is the same as the piezoelectric transformer of the fifth embodiment.

In the piezoelectric transformer 231 of this embodiment, a plurality of the floating electrodes 237 are stacked between the internal electrodes 233 and 234, suppressing the diffusion of the internal electrode constituent metal from the internal electrodes 233 and 234 in the thickness direction during firing for obtaining the sintered ceramic compact body 232. In other words, although the internal electrode constituent metal which constitutes the internal electrodes 233 and 234 tends to diffuse to the ceramic side during firing, a floating electrode constituent metal also tends to diffuse from the floating electrodes 237 opposed to the internal electrodes in the thickness direction. Therefore, the diffusion of the internal electrode constituent metal from the internal electrodes 233 and 234 is suppressed.

As a result, the shape of the internal electrodes 233 and 234 is maintained substantially according to design values, and thus variations in the maximum efficiency can be decreased, as compared with a conventional piezoelectric transformer.

Of course, the maximum efficiency can be increased by decreasing the thickness of each of the ceramic layers between the internal electrodes 233 and 234, but in some cases, the thickness of the ceramic layers between the internal electrodes cannot be decreased from the viewpoint of design of input impedance of a piezoelectric transformer.

In the piezoelectric transformer 231 comprising the floating electrodes 237, even when the ceramic layers between the internal electrodes are thick, the diffusion of the internal electrode constituent metal can be suppressed without changes in input impedance. Therefore, the piezoelectric transformer 231 is suitable for application requiring high input impedance and high precision of variation in the maximum efficiency.

The floating electrodes 237 may also be arranged in the ceramic layers outside the outermost internal electrodes 233 and 234 in the stacking direction. In this case, it is possible to suppress the outward diffusion of the internal electrode constituent metal from the outermost internal electrodes 233 and 234 in the stacking direction.

Although not shown in the drawings, the floating electrodes 235 which constitute the piezoelectric transformer 231 of the second embodiment, may be provided in the piezoelectric transformer 222 of the fifth embodiment in order to suppress the diffusion of the internal electrode constituent metal from the internal electrodes 211 and 214 in the thickness direction, thereby further decreasing variations in the maximum efficiency. Similarly, like in the piezoelectric transformer 222 of the fifth embodiment, the dummy electrodes 212 and 215 may be provided in the piezoelectric transformer 231 of the sixth embodiment, thereby effectively suppressing the horizontal diffusion of the internal electrode constituent metal from the ends of the internal electrodes on the side not connected to the external electrodes 211 and 214.

As described above, in the piezoelectric transformer of the present invention, the dummy electrodes are respectively provided between the ends of the internal electrodes opposite to the ends thereof connected to the external electrodes, and the external electrodes not connected to the internal electrodes at the heights where the internal electrodes are respectively formed in the sintered ceramic compact body. Therefore, the presence of the dummy electrodes suppresses the diffusion of the internal electrode constituent metal into ceramic during firing, thereby preventing undesired phenomena such as breakage of the internal electrodes, and forming the internal electrodes having a shape having approximate design values. It is thus possible to provide a piezoelectric transformer exhibiting high maximum efficiency, and less variation in the maximum efficiency.

Where the floating electrodes are arranged in the piezoelectric transformer of the present invention, the presence of the floating electrodes suppresses the diffusion of the internal electrode constituent metal in the thickness direction, thereby further preventing breakage of the internal electrode, etc. It is thus possible to further decrease variations in the maximum efficiency.

In the present invention, where the gap distance between the dummy electrode-side ends of the internal electrodes and the dummy electrodes is in the range from the thickness of each of the ceramic layers between the internal electrodes to 300 m, dielectric breakdown less occurs during polarization, and the diffusion of the internal electrode constituent metal from the internal electrodes can be effectively suppressed, thereby obtaining a piezoelectric transformer exhibiting high maximum efficiency and small variations in the maximum efficiency.

Where one floating electrode is arranged in at least one ceramic layers of the ceramic layers between the internal electrodes and/or the ceramic layers outside the outermost internal electrodes in the stacking direction, the presence of the floating electrode suppresses the diffusion of the internal electrode constituent metal from the internal electrodes to the floating electrode side, thereby preventing undesired phenomena such as breakage of the internal electrode, etc, and forming the internal electrodes having approximate design values. It is thus possible to provide a piezoelectric transformer exhibiting high maximum efficiency and small variations in the maximum efficiency.

The method of manufacturing a piezoelectric transformer of the present invention for obtaining the above-described piezoelectric transformer comprises stacking green sheets on each of which an internal electrode and dummy electrode are printed, and then firing the resultant layered product to obtain a sintered ceramic compact body. Therefore, the presence of the dummy electrodes suppresses the diffusion of the internal electrode constituent metal to ceramic, thereby securely forming the internal electrodes having a shape with approximate design values. It is thus possible to increase the maximum efficiency of a piezoelectric transformer, and decrease variations in the maximum efficiency.

The method of manufacturing a piezoelectric transformer of the present invention further comprises stacking green sheets, on each of which a floating electrode is printed, between the internal electrodes or outside the outermost internal electrodes. Therefore, the presence of both the dummy electrodes and the floating electrodes suppresses the diffusion of the internal electrode constituent metal during firing. It is thus possible to provide a piezoelectric transformer exhibiting less variation in the maximum efficiency.

What is claimed is:

1. A method of manufacturing a piezoelectric actuator comprising the steps of:

printing an internal electrode and a dummy electrode on each of a plurality of green sheets such that the internal electrode extends from one side of each of the plurality of green sheets and such that the dummy electrode extends from the other side of each of the plurality of green sheets;

stacking the plurality of green sheets to obtain a layered product such that the internal electrodes alternately extend from first and second sides of the layered product;

firing the layered product to obtain a sintered ceramic compact body;

respectively forming first and second external electrodes on the first and second sides of the sintered ceramic compact body; and applying a DC electric field between the first and second external electrodes to polarize the sintered ceramic compact body to make sintered ceramic compact body piezoelectrically active.

* * * * *